US007783375B2

(12) United States Patent
Shanmugasundram et al.

(10) Patent No.: US 7,783,375 B2
(45) Date of Patent: Aug. 24, 2010

(54) DYNAMIC METROLOGY SCHEMES AND SAMPLING SCHEMES FOR ADVANCED PROCESS CONTROL IN SEMICONDUCTOR PROCESSING

(75) Inventors: Arulkumar P. Shanmugasundram, Sunnyvale, CA (US); Alexander T. Schwarm, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 178 days.

(21) Appl. No.: 12/006,318

(22) Filed: Dec. 31, 2007

(65) Prior Publication Data

US 2008/0109089 A1 May 8, 2008

Related U.S. Application Data

(62) Division of application No. 10/135,451, filed on May 1, 2002, now Pat. No. 7,698,012.

(60) Provisional application No. 60/322,459, filed on Sep. 17, 2001, provisional application No. 60/298,878, filed on Jun. 19, 2001.

(51) Int. Cl.
G06F 19/00 (2006.01)
(52) U.S. Cl. .......................... 700/121; 702/83
(58) Field of Classification Search .................. 702/83; 700/110, 121
See application file for complete search history.

(56) References Cited

U.S. PATENT DOCUMENTS

| 3,205,485 | A | 9/1965 | Noltingk |
| 3,229,198 | A | 1/1966 | Libby |
| 3,767,900 | A | 10/1973 | Chao et al. |
| 3,920,965 | A | 11/1975 | Sohrwardy |
| 4,000,458 | A | 12/1976 | Miller et al. |
| 4,207,520 | A | 6/1980 | Flora et al. |
| 4,209,744 | A | 6/1980 | Gerasimov et al. |

(Continued)

FOREIGN PATENT DOCUMENTS

CA 2050247 8/1991

(Continued)

OTHER PUBLICATIONS

U.S. Appl. No. 09/363,966, filed Jul. 29, 1999, Arackaparambil et al., Computer Integrated Manufacturing Techniques.

(Continued)

Primary Examiner—Ryan A Jarrett
(74) Attorney, Agent, or Firm—Blakely Sokoloff Taylor & Zafman LLP

(57) ABSTRACT

Systems, methods and mediums are provided for dynamic adjustment of sampling plans in connection with a wafer (or other device) to be measured. The invention adjusts the frequency and/or spatial resolution of measurements on an as-needed basis when one or more events occur that are likely to indicate an internal or external change affecting the manufacturing process or results. The dynamic metrology plan adjusts the spatial resolution of sampling within-wafer by adding, subtracting or replacing candidate points from the sampling plan, in response to certain events which suggest that additional or different measurements of the wafer may be desirable. Further, the invention may be used in connection with adjusting the frequency of wafer-to-wafer measurements.

19 Claims, 6 Drawing Sheets

U.S. PATENT DOCUMENTS

| | | |
|---|---|---|
| 4,302,721 A | 11/1981 | Urbanek et al. |
| 4,368,510 A | 1/1983 | Anderson |
| 4,609,870 A | 9/1986 | Lale et al. |
| 4,616,308 A | 10/1986 | Morshedi et al. |
| 4,663,703 A | 5/1987 | Axelby et al. |
| 4,698,766 A | 10/1987 | Entwistle et al. |
| 4,717,596 A | 1/1988 | Barbee et al. |
| 4,750,141 A | 6/1988 | Judell et al. |
| 4,755,753 A | 7/1988 | Chern |
| 4,757,259 A | 7/1988 | Charpentier |
| 4,796,194 A | 1/1989 | Atherton |
| 4,901,218 A | 2/1990 | Cornwell |
| 4,938,600 A | 7/1990 | Into |
| 4,957,605 A | 9/1990 | Hurwitt et al. |
| 4,967,381 A | 10/1990 | Lane et al. |
| 4,974,543 A | 12/1990 | Jansen |
| 5,089,970 A | 2/1992 | Lee et al. |
| 5,108,570 A | 4/1992 | Wang |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. |
| 5,329,463 A | 7/1994 | Sierk et al. |
| 5,338,630 A | 8/1994 | Yoon et al. |
| 5,347,446 A | 9/1994 | Iino et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,837 A | 8/1995 | Bomans et al. |
| 5,469,361 A | 11/1995 | Moyne |
| 5,485,082 A | 1/1996 | Wisspeintner et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,535,128 A | 7/1996 | Laube et al. |
| 5,541,510 A | 7/1996 | Danielson |
| 5,546,179 A | 8/1996 | Cheng |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,627,083 A | 5/1997 | Tounai |
| 5,629,216 A | 5/1997 | Wijaranakula et al. |
| 5,642,296 A | 6/1997 | Saxena |
| 5,646,870 A | 7/1997 | Krivokapic et al. |
| 5,649,169 A | 7/1997 | Berezin et al. |
| 5,654,903 A | 8/1997 | Reitman et al. |
| 5,655,951 A | 8/1997 | Meikle et al. |
| 5,657,254 A | 8/1997 | Sierk et al. |
| 5,660,895 A | 8/1997 | Lee et al. |
| 5,661,669 A | 8/1997 | Mozumder et al. |
| 5,663,797 A | 9/1997 | Sandhu |
| 5,664,987 A | 9/1997 | Renteln |
| 5,664,990 A | 9/1997 | Adams et al. |
| 5,665,199 A | 9/1997 | Sahota et al. |
| 5,665,214 A | 9/1997 | Iturralde |
| 5,666,297 A | 9/1997 | Britt et al. |
| 5,667,424 A | 9/1997 | Pan |
| 5,674,787 A | 10/1997 | Zhao et al. |
| 5,694,325 A | 12/1997 | Fukuda et al. |
| 5,695,810 A | 12/1997 | Dubin et al. |
| 5,698,989 A | 12/1997 | Nulman |
| 5,711,843 A | 1/1998 | Jahns |
| 5,719,495 A | 2/1998 | Moslehi |
| 5,719,796 A | 2/1998 | Chen |
| 5,733,171 A | 3/1998 | Allen et al. |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,761,065 A | 6/1998 | Kittler et al. |
| 5,764,543 A | 6/1998 | Kennedy |
| 5,777,901 A | 7/1998 | Berezin et al. |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,859,975 A | 1/1999 | Brewer et al. |
| 5,862,054 A | 1/1999 | Li |
| 5,863,807 A | 1/1999 | Jang et al. |
| 5,867,389 A | 2/1999 | Hamada et al. |
| 5,870,306 A | 2/1999 | Harada |
| 5,871,805 A | 2/1999 | Lemelson |
| 5,874,345 A | 2/1999 | Coronel et al. |
| 5,883,437 A | 3/1999 | Maruyama et al. |
| 5,889,991 A | 3/1999 | Consolatti et al. |
| 5,901,313 A | 5/1999 | Wolf et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A | 6/1999 | Saxena et al. |
| 5,916,016 A | 6/1999 | Bothra |
| 5,923,553 A | 7/1999 | Yi |
| 5,926,690 A | 7/1999 | Toprac et al. |
| 5,930,138 A | 7/1999 | Lin et al. |
| 5,937,323 A | 8/1999 | Orczyk et al. |
| 5,940,300 A | 8/1999 | Ozaki |
| 5,943,237 A | 8/1999 | Van Boxem |
| 5,943,550 A | 8/1999 | Fulford, Jr. et al. |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,975,994 A | 11/1999 | Sandhu et al. |
| 5,978,751 A | 11/1999 | Pence et al. |
| 5,982,920 A | 11/1999 | Tobin, Jr. et al. |

| | | | | | | |
|---|---|---|---|---|---|---|
| 6,002,989 | A | 12/1999 | Shiba et al. | 6,249,712 | B1 | 6/2001 | Boiquaye |
| 6,012,048 | A | 1/2000 | Gustin et al. | 6,252,412 | B1 | 6/2001 | Talbot et al. |
| 6,017,771 | A | 1/2000 | Yang et al. | 6,253,366 | B1 | 6/2001 | Mutschler, III |
| 6,036,349 | A | 3/2000 | Gombar | 6,259,160 | B1 | 7/2001 | Lopatin et al. |
| 6,037,664 | A | 3/2000 | Zhao et al. | 6,263,255 | B1 | 7/2001 | Tan et al. |
| 6,041,263 | A | 3/2000 | Boston et al. | 6,268,270 | B1 | 7/2001 | Scheid et al. |
| 6,041,270 | A | 3/2000 | Steffan et al. | 6,271,670 | B1 | 8/2001 | Caffey |
| 6,054,379 | A | 4/2000 | Yau et al. | 6,276,989 | B1 | 8/2001 | Campbell et al. |
| 6,059,636 | A | 5/2000 | Inaba et al. | 6,277,014 | B1 | 8/2001 | Chen et al. |
| 6,064,759 | A | 5/2000 | Buckley et al. | 6,278,899 | B1 | 8/2001 | Piche et al. |
| 6,072,313 | A | 6/2000 | Li et al. | 6,280,289 | B1 | 8/2001 | Wiswesser et al. |
| 6,074,443 | A | 6/2000 | Venkatesh et al. | 6,281,127 | B1 | 8/2001 | Shue |
| 6,074,517 | A | 6/2000 | Taravade | 6,284,622 | B1 | 9/2001 | Campbell et al. |
| 6,077,412 | A | 6/2000 | Ting et al. | 6,287,879 | B1 | 9/2001 | Gonzales et al. |
| 6,078,845 | A | 6/2000 | Friedman | 6,290,572 | B1 | 9/2001 | Hofmann |
| 6,094,688 | A | 7/2000 | Mellen-Garnett et al. | 6,291,367 | B1 | 9/2001 | Kelkar |
| 6,096,649 | A | 8/2000 | Jang | 6,292,708 | B1 | 9/2001 | Allen et al. |
| 6,097,887 | A | 8/2000 | Hardikar et al. | 6,298,274 | B1 | 10/2001 | Inoue |
| 6,100,195 | A | 8/2000 | Chan et al. | 6,298,470 | B1 | 10/2001 | Breiner et al. |
| 6,108,092 | A | 8/2000 | Sandhu | 6,303,395 | B1 | 10/2001 | Nulman |
| 6,111,634 | A | 8/2000 | Pecen et al. | 6,304,999 | B1 | 10/2001 | Toprac et al. |
| 6,112,130 | A | 8/2000 | Fukuda et al. | 6,307,628 | B1 | 10/2001 | Lu et al. |
| 6,113,462 | A | 9/2000 | Yang | 6,314,379 | B1 | 11/2001 | Hu et al. |
| 6,114,238 | A | 9/2000 | Liao | 6,317,643 | B1 | 11/2001 | Dmochowski |
| 6,123,983 | A | 9/2000 | Smith, Jr. et al. | 6,320,655 | B1 | 11/2001 | Matsushita et al. |
| 6,127,263 | A | 10/2000 | Parikh | 6,324,481 | B1 | 11/2001 | Atchison et al. |
| 6,128,016 | A | 10/2000 | Coelho et al. | 6,334,807 | B1 | 1/2002 | Lebel et al. |
| 6,136,163 | A | 10/2000 | Cheung et al. | 6,336,841 | B1 | 1/2002 | Chang |
| 6,141,660 | A | 10/2000 | Bach et al. | 6,339,727 | B1 | 1/2002 | Ladd |
| 6,143,646 | A | 11/2000 | Wetzel | 6,340,602 | B1 | 1/2002 | Johnson et al. |
| 6,148,099 | A | 11/2000 | Lee et al. | 6,345,288 | B1 | 2/2002 | Reed et al. |
| 6,148,239 | A | 11/2000 | Funk et al. | 6,345,315 | B1 | 2/2002 | Mishra |
| 6,148,246 | A | 11/2000 | Kawazome | 6,346,426 | B1 | 2/2002 | Toprac et al. |
| 6,150,270 | A | 11/2000 | Matsuda et al. | 6,355,559 | B1 | 3/2002 | Havemann et al. |
| 6,157,864 | A | 12/2000 | Schwenke et al. | 6,360,133 | B1 | 3/2002 | Campbell et al. |
| 6,159,073 | A | 12/2000 | Wiswesser et al. | 6,360,184 | B1 | 3/2002 | Jacquez |
| 6,159,075 | A | 12/2000 | Zhang | 6,363,294 | B1 | 3/2002 | Coronel et al. |
| 6,159,644 | A | 12/2000 | Satoh et al. | 6,366,934 | B1 | 4/2002 | Cheng et al. |
| 6,161,054 | A | 12/2000 | Rosenthal et al. | 6,368,879 | B1 | 4/2002 | Toprac |
| 6,169,931 | B1 | 1/2001 | Runnels | 6,368,883 | B1 | 4/2002 | Bode et al. |
| 6,172,756 | B1 | 1/2001 | Chalmers et al. | 6,368,884 | B1 | 4/2002 | Goodwin et al. |
| 6,173,240 | B1 | 1/2001 | Sepulveda et al. | 6,379,980 | B1 | 4/2002 | Toprac |
| 6,175,777 | B1 | 1/2001 | Kim | 6,381,564 | B1 | 4/2002 | Davis et al. |
| 6,178,390 | B1 | 1/2001 | Jun | 6,388,253 | B1 | 5/2002 | Su |
| 6,181,013 | B1 | 1/2001 | Liu et al. | 6,389,491 | B1 | 5/2002 | Jacobson et al. |
| 6,183,345 | B1 | 2/2001 | Kamono et al. | 6,391,780 | B1 | 5/2002 | Shih et al. |
| 6,185,324 | B1 | 2/2001 | Ishihara et al. | 6,395,152 | B1 | 5/2002 | Wang |
| 6,191,864 | B1 | 2/2001 | Sandhu | 6,397,114 | B1 | 5/2002 | Eryurek et al. |
| 6,192,291 | B1 | 2/2001 | Kwon | 6,400,162 | B1 | 6/2002 | Mallory et al. |
| 6,194,231 | B1 | 2/2001 | Ho-Cheng et al. | 6,405,096 | B1 | 6/2002 | Toprac et al. |
| 6,197,604 | B1 | 3/2001 | Miller et al. | 6,405,144 | B1 | 6/2002 | Toprac et al. |
| 6,201,208 | B1 | 3/2001 | Wendt et al. | 6,417,014 | B1 | 7/2002 | Lam et al. |
| 6,204,165 | B1 | 3/2001 | Ghoshal | 6,427,093 | B1 | 7/2002 | Toprac |
| 6,210,983 | B1 | 4/2001 | Atchison et al. | 6,432,728 | B1 | 8/2002 | Tai et al. |
| 6,211,094 | B1 | 4/2001 | Jun et al. | 6,435,952 | B1 | 8/2002 | Boyd et al. |
| 6,212,961 | B1 | 4/2001 | Dvir | 6,438,438 | B1 | 8/2002 | Takagi et al. |
| 6,214,734 | B1 | 4/2001 | Bothra et al. | 6,440,295 | B1 | 8/2002 | Wang |
| 6,217,412 | B1 | 4/2001 | Campbell et al. | 6,442,496 | B1 * | 8/2002 | Pasadyn et al. ............... 702/83 |
| 6,217,658 | B1 | 4/2001 | Orczyk et al. | 6,449,524 | B1 | 9/2002 | Miller et al. |
| 6,219,711 | B1 | 4/2001 | Chari | 6,455,415 | B1 | 9/2002 | Lopatin et al. |
| 6,222,936 | B1 | 4/2001 | Phan et al. | 6,455,937 | B1 | 9/2002 | Cunningham |
| 6,226,563 | B1 | 5/2001 | Lim | 6,465,263 | B1 | 10/2002 | Coss, Jr. et al. |
| 6,226,792 | B1 | 5/2001 | Goiffon et al. | 6,469,518 | B1 | 10/2002 | Davis et al. |
| 6,228,280 | B1 | 5/2001 | Li et al. | 6,470,230 | B1 | 10/2002 | Toprac et al. |
| 6,230,069 | B1 | 5/2001 | Campbell et al. | 6,477,432 | B1 * | 11/2002 | Chen et al. .................... 700/51 |
| 6,232,236 | B1 | 5/2001 | Shan et al. | 6,479,902 | B1 | 11/2002 | Lopatin et al. |
| 6,236,903 | B1 | 5/2001 | Kim et al. | 6,479,990 | B2 | 11/2002 | Mednikov et al. |
| 6,237,050 | B1 | 5/2001 | Kim et al. | 6,482,660 | B2 | 11/2002 | Conchieri et al. |
| 6,240,330 | B1 | 5/2001 | Kurtzberg et al. | 6,484,064 | B1 | 11/2002 | Campbell |
| 6,240,331 | B1 | 5/2001 | Yun | 6,486,492 | B1 | 11/2002 | Su |
| 6,245,581 | B1 | 6/2001 | Bonser et al. | 6,492,281 | B1 | 12/2002 | Song et al. |
| 6,246,972 | B1 | 6/2001 | Klimasauskas | 6,494,766 | B1 | 12/2002 | Wiswesser et al. |
| 6,248,602 | B1 | 6/2001 | Bode et al. | 6,495,452 | B1 | 12/2002 | Shih |

| | | |
|---|---|---|
| 6,503,839 B2 | 1/2003 | Gonzales et al. |
| 6,515,368 B1 | 2/2003 | Lopatin et al. |
| 6,517,413 B1 | 2/2003 | Hu et al. |
| 6,517,414 B1 | 2/2003 | Tobin et al. |
| 6,528,409 B1 | 3/2003 | Lopatin et al. |
| 6,529,789 B1 | 3/2003 | Campbell et al. |
| 6,532,555 B1 | 3/2003 | Miller et al. |
| 6,535,783 B1 | 3/2003 | Miller et al. |
| 6,537,912 B1 | 3/2003 | Agarwal |
| 6,540,591 B1 | 4/2003 | Pasadyn et al. |
| 6,541,401 B1 | 4/2003 | Herner et al. |
| 6,546,508 B1 | 4/2003 | Sonderman et al. |
| 6,556,881 B1 | 4/2003 | Miller |
| 6,560,504 B1 | 5/2003 | Goodwin et al. |
| 6,563,308 B2 | 5/2003 | Nagano et al. |
| 6,567,717 B2 | 5/2003 | Krivokapic et al. |
| 6,577,914 B1 | 6/2003 | Bode |
| 6,580,958 B1 | 6/2003 | Takano |
| 6,582,277 B2 | 6/2003 | Korovin |
| 6,587,744 B1 | 7/2003 | Stoddard et al. |
| 6,590,179 B2 | 7/2003 | Tanaka et al. |
| 6,604,012 B1 | 8/2003 | Cho et al. |
| 6,605,549 B2 | 8/2003 | Leu et al. |
| 6,607,976 B2 | 8/2003 | Chen et al. |
| 6,609,946 B1 | 8/2003 | Tran |
| 6,616,513 B1 | 9/2003 | Osterheld |
| 6,618,692 B2 | 9/2003 | Takahashi et al. |
| 6,624,075 B1 | 9/2003 | Lopatin et al. |
| 6,625,497 B2 | 9/2003 | Fairbairn et al. |
| 6,630,741 B1 | 10/2003 | Lopatin et al. |
| 6,640,151 B1 | 10/2003 | Somekh et al. |
| 6,652,355 B2 | 11/2003 | Wiswesser et al. |
| 6,660,633 B1 | 12/2003 | Lopatin et al. |
| 6,669,782 B1 | 12/2003 | Thakur |
| 6,678,570 B1 | 1/2004 | Pasadyn et al. |
| 6,708,074 B1 | 3/2004 | Chi et al. |
| 6,708,075 B2 | 3/2004 | Sonderman et al. |
| 6,725,402 B1 | 4/2004 | Coss, Jr. et al. |
| 6,728,587 B2 | 4/2004 | Goldman et al. |
| 6,735,492 B2 | 5/2004 | Conrad et al. |
| 6,751,518 B1 | 6/2004 | Sonderman et al. |
| 6,774,998 B1 | 8/2004 | Wright et al. |
| 6,913,938 B2 | 7/2005 | Shanmugasundram et al. |
| 6,988,017 B2 | 1/2006 | Pasadyn et al. |
| 7,160,739 B2 | 1/2007 | Shanmugasundram et al. |
| 2001/0001755 A1 | 5/2001 | Sandhu et al. |
| 2001/0003084 A1 | 6/2001 | Finarov |
| 2001/0006873 A1 | 7/2001 | Moore |
| 2001/0030366 A1 | 10/2001 | Nakano et al. |
| 2001/0039462 A1 | 11/2001 | Mendez et al. |
| 2001/0040997 A1 | 11/2001 | Tsap et al. |
| 2001/0042690 A1 | 11/2001 | Talieh |
| 2001/0044667 A1 | 11/2001 | Nakano et al. |
| 2002/0032499 A1 | 3/2002 | Wilson et al. |
| 2002/0058460 A1 | 5/2002 | Lee et al. |
| 2002/0070126 A1 | 6/2002 | Sato et al. |
| 2002/0077031 A1 | 6/2002 | Johansson et al. |
| 2002/0081951 A1 | 6/2002 | Boyd et al. |
| 2002/0089676 A1 | 7/2002 | Pecen et al. |
| 2002/0102853 A1 | 8/2002 | Li et al. |
| 2002/0107599 A1 | 8/2002 | Patel et al. |
| 2002/0107604 A1 | 8/2002 | Riley et al. |
| 2002/0113039 A1 | 8/2002 | Mok et al. |
| 2002/0127950 A1 | 9/2002 | Hirose et al. |
| 2002/0128805 A1 | 9/2002 | Goldman et al. |
| 2002/0149359 A1 | 10/2002 | Crouzen et al. |
| 2002/0165636 A1 | 11/2002 | Hasan |
| 2002/0183986 A1 | 12/2002 | Stewart et al. |
| 2002/0185658 A1 | 12/2002 | Inoue et al. |
| 2002/0193899 A1 | 12/2002 | Shanmugasundram et al. |
| 2002/0193902 A1 | 12/2002 | Shanmugasundram et al. |
| 2002/0197745 A1 | 12/2002 | Shanmugasundram et al. |
| 2002/0197934 A1 | 12/2002 | Paik |
| 2002/0199082 A1 | 12/2002 | Shanmugasundram et al. |
| 2003/0017256 A1 | 1/2003 | Shimane |
| 2003/0020909 A1 | 1/2003 | Adams et al. |
| 2003/0020928 A1 | 1/2003 | Ritzdorf et al. |
| 2003/0154062 A1 | 8/2003 | Daft et al. |
| 2005/0221514 A1* | 10/2005 | Pasadyn et al. ............... 438/14 |
| 2007/0102116 A1 | 5/2007 | Shanmugasundram et al. |
| 2008/0133163 A1 | 6/2008 | Shanmugasundram et al. |

FOREIGN PATENT DOCUMENTS

| | | |
|---|---|---|
| CA | 2165847 | 8/1991 |
| CA | 2194855 | 8/1991 |
| EP | 0397924 | 11/1990 |
| EP | 0621522 | 10/1994 |
| EP | 0747795 | 12/1996 |
| EP | 0869652 | 10/1998 |
| EP | 0877308 | 11/1998 |
| EP | 0881040 | 12/1998 |
| EP | 0895145 | 2/1999 |
| EP | 0910123 | 4/1999 |
| EP | 0932194 | 7/1999 |
| EP | 0932195 | 7/1999 |
| EP | 1066925 | 1/2001 |
| EP | 1067757 | 1/2001 |
| EP | 1071128 | 1/2001 |
| EP | 1083470 | 3/2001 |
| EP | 1092505 | 4/2001 |
| EP | 1072967 | 11/2001 |
| EP | 1182526 | 2/2002 |
| GB | 2347885 | 9/2000 |
| GB | 2365215 | 2/2002 |
| JP | 61-66104 | 4/1986 |
| JP | 61-171147 | 8/1986 |
| JP | 01-283934 | 11/1989 |
| JP | 3-202710 | 9/1991 |
| JP | 05-151231 | 6/1993 |
| JP | 05-5136098 | 7/1993 |
| JP | 05-5190457 | 7/1993 |
| JP | 05-216896 | 8/1993 |
| JP | 05-266029 | 10/1993 |
| JP | 06-110894 | 4/1994 |
| JP | 06-176994 | 6/1994 |
| JP | 06-184434 | 7/1994 |
| JP | 06-252236 | 9/1994 |
| JP | 06-260380 | 9/1994 |
| JP | 8-23166 | 1/1996 |
| JP | 08-50161 | 2/1996 |
| JP | 08-149583 | 6/1996 |
| JP | 08-304023 | 11/1996 |
| JP | 09-34535 | 2/1997 |
| JP | 9-246547 | 9/1997 |
| JP | 09-269294 | 10/1997 |
| JP | 10-34522 | 2/1998 |
| JP | 10-173029 | 6/1998 |
| JP | 11-67853 | 3/1999 |
| JP | 11-126816 | 5/1999 |
| JP | 11-135601 | 5/1999 |
| JP | 2000-183001 | 6/2000 |
| JP | 2001-76982 | 3/2001 |
| JP | 2001-284299 | 10/2001 |
| JP | 2001-305108 | 10/2001 |
| JP | 2002-9030 | 1/2002 |
| JP | 2002-343754 | 11/2002 |
| TW | 434103 | 5/2001 |
| TW | 436383 | 5/2001 |
| TW | 455938 | 9/2001 |
| TW | 455976 | 9/2001 |
| WO | WO 95/34866 | 12/1995 |
| WO | WO 98/05066 | 2/1998 |
| WO | WO 98/45090 | 10/1998 |
| WO | WO 99/09371 | 2/1999 |
| WO | WO 99/25520 | 5/1999 |

| | | |
|---|---|---|
| WO | WO 99/59200 | 11/1999 |
| WO | WO 00/00874 | 1/2000 |
| WO | WO 00/05759 | 2/2000 |
| WO | WO 00/35063 | 6/2000 |
| WO | WO 00/54325 | 9/2000 |
| WO | WO 00/79355 | 12/2000 |
| WO | WO 01/11679 | 2/2001 |
| WO | WO 01/15865 | 3/2001 |
| WO | WO 01/18623 | 3/2001 |
| WO | WO 01/25865 | 4/2001 |
| WO | WO 01/33277 | 5/2001 |
| WO | WO 01/33501 | 5/2001 |
| WO | WO 01/52055 | 7/2001 |
| WO | WO 01/52319 | 7/2001 |
| WO | WO 01/57823 | 8/2001 |
| WO | WO 01/80306 | 10/2001 |
| WO | WO 02/17150 | 2/2002 |
| WO | WO 02/31613 A2 | 4/2002 |
| WO | WO 02/33737 | 4/2002 |
| WO | WO 02/074491 | 9/2002 |
| WO | WO 02/103778 | 12/2002 |

OTHER PUBLICATIONS

U.S. Appl. No. 09/469,227, filed Dec. 22, 1999, Smoekh et al., Multi-Tool Control System, Method and Medium.
U.S. Appl. No. 09/619,044, filed Jul. 19, 2000, Yuan, System and Method of Exporting or Importing Object Data in a Manufacturing Execution System.
U.S. Appl. No. 09/637,620, filed Aug. 11, 2000, Chi et al., Generic Interface Builder.
U.S. Appl. No. 09/656,031, filed Sep. 6, 2000, Chi et al., Dispatching Component for Associating Manufacturing Facility Service Requestors with Service Providers.
U.S. Appl. No. 09/655,542, filed Sep. 6, 2000, Yuan, System, Method and Medium for Defining Palettes to Transform an Application Program Interface for a Service.
U.S. Appl. No. 09/725,908, filed Nov. 30, 2000, Chi et al., Dynamic Subject Information Generation in Message Services of Distributed Object Systems.
U.S. Appl. No. 09/800,980, filed Mar. 8, 2001, Hawkins et al., Dynamic and Extensible Task Guide.
U.S. Appl. No. 09/811,667, filed Mar. 20, 2001, Yuan et al., Fault Tolerant and Automated Computer Software Workflow.
U.S. Appl. No. 09/927,444, filed Aug. 13, 2001, Ward et al., Dynamic Control of Wafer Processing Paths in Semiconductor Manufacturing Processes.
U.S. Appl. No. 09/928,473, filed Aug. 14, 2001, Koh, Tool Services Layer for Providing Tool Service Functions in Conjunction with Tool Functions.
U.S. Appl. No. 09/928,474, filed Aug. 14, 2001, Krishnamurthy et al., Experiment Management System, Method and Medium.
U.S. Appl. No. 09/943,383, filed Aug. 31, 2001, Shanmugasundram et al., In Situ Based Control of Semiconductor Processing Procedure.
U.S. Appl. No. 09/943,955, filed Aug. 31, 2001, Shanmugasundram et al., Feedback Control of a Chemical Mechanical Polishing Device Providing Manipulation of Removal Rate Profiles.
U.S. Appl. No. 09/998,372, filed Nov. 30, 2001, Paik, Control of Chemical Mechanical Polishing Pad Conditioner Directional Velocity to Improve Pad Life.
U.S. Appl. No. 09/998,384, filed Nov. 30, 2001, Paik, Feedforward and Feedback Control for Conditioning of Chemical Mechanical Polishing Pad.
U.S. Appl. No. 10/084,092, filed Feb. 28, 2002, Arackaparambil et al., Computer Integrated Manufacturing Techniques.
U.S. Appl. No. 10/100,184, filed Mar. 19, 2002, Al-Bayati et al., Method, System and Medium for Controlling Semiconductor Wafer Processes Using Critical Dimension Measurements.
U.S. Appl. No. 10/135,405, filed May 1, 2002, Reiss et al., Integration of Fault Detection with Run-to-Run Control.
U.S. Appl. No. 10/135,451, filed May 1, 2002, Shanmugasundram et al.
U.S. Appl. No. 10/172,977, filed Jun. 18, 2002, Shanmugasundram et al.
U.S. Appl. No. 10/173,108, filed Jun. 18, 2002, Shanmugasundram et al.
U.S. Appl. No. 10/174,370, filed Jun. 18, 2002, Shanmugasundram et al.
ACM Research, Inc. 2000, "Advanced Copper Metallization for 0.13 to 0.05 µm & Beyond," http://acmrc.com/press/ACM-ECP-brochure.pdf 4 pages.
ACM Research, Inc. 2002, "ACM Ultra ECP® System: Electro-Copper Plating (ECP) Deposition," www.acmrc.com/ecp.html 2 pages.
Adams, Bret W., et al., "Full-Wafer Endpoint Detection Improves Process Control in Copper CMP," Semiconductor Fabtech- 12th Edition, Applied Materials, Inc., Santa Clara, CA, pp. 283-289.
Adetech, "ADE Technologies, Inc.—6360," www.adetech.com/6360.shtml. 4 pages.
Adetech, "Microsense II Capacitance Gaging System," www.adetech.com 2 pages.
Adetech, "Microsense II—5810: Non-Contact Capacitance Gaging Module," www.adetech.com 2 pages.
Applied Materials, Inc. 2002. "Applied Materials: Information for Everyone: Copper Electrochemical Plating," www.appliedmaterials.com/products/copper._electrochemical.plating.html 1 page.
Austrian Search Report prepared by the Austrian Patent Office for Singapore Patent Application No. 200004286-1, Oct. 15, 2001.
Baliga, John, "Advanced Process Control: Soon to be a Must," Cahners Semiconductor International, Jul. 1999. http://www.semiconductor.net/article/CA170290.html 7 pages.
Berman, Mike, et al., "Review of In Situ & In-line Detection for CMP Applications," Semiconductor Fabtech 8th Edition, pp. 267-274.
Burke, Peter A., "Semi-Empirical Modeling of SiO2 Chemical-Mechanical Polishing Planarization," VMIC Conference, 1991 IEEE, pp. 379-384, IEEE, Jun. 1991.
Boning, Duane et al. "Run by Run Control of Chemical-Mechanical Polishing," IEEE Trans. CPMT (C) vol. 19, No. 4, pp. 307-314, Oct. 1996.
Boning, Duane et al., "Statistical Methods for Semiconductor Manufacturing," Encyclopedia of Electronic Engineering, J.G. Webster, Ed., Feb. 1999, pp. 1-22.
Campbell, W., et al., "A Comparison of Run-to-Run Control Algorithms," (Abstract) Proceedings of the 2002 American Control Conference, vol. 3, pp. 2150-2155, May 2002.
Campbell, W., et al., "Run-to-Run Control in Microelectronics Manufacturing." Advanced Micro Devises, TWMCC, Feb. 11-12, 1998.
Chaudhry, Nauman, et. al, "Active Controller: Utilizing Active Databases for Implementing Multi-Step Control of Semiconductor Manufacturing," (Abstract), IEEE Transaction on Components, Packaging and Manufacturing Technology, part C, vol. 21, No. 3. pp. 217-224, Jul. 1998.
Chang, E., "Using a Statistical Metrology Framework to Identify Systematic and Random Sources of Die- and Wafer-level ILD Thickness Variation in CMP Processes." Washington, D.C.: International Electron Devices Meeting, Dec. 1995.
Chang, Norman H., et al., "Continuous Equipment Diagnosis Using Evidence Integration: An LPCVD Application," IEEE Transactions on Semiconductor Manufacturing, vol. 4, No. 1, pp. 43-51, Feb. 1991.
Chemali, Chadi El, et al., "Multizone Uniformity Control of a Chemical Mechanical Polishing Process Utilizing a Pre and Postmeasurement Strategy," Journal of Vacuum Science and Technology, vol. 18, No. 4, Jul./Aug. 2000, pp. 1287-1296.
Chen, Argon, et al, "Age-Based Double EWMA Controller and Its Application t CMP Processes," IEEE Transactions on Semiconductor Manufacturing, vol. 14, No. 1, pp. 11-19.
Cheung, Robin, "Copper Interconnect Technology," Oct. 18, 2000, AVS/CMP User Group Meeting, Santa Clara, CA.
Consilium. 1998. FAB300™ Mountain View, California: Consilium, Inc.
Consilium. Aug. 1998. Quality Management Component: QMC™ and QMC-Link™ Overview. Mountain View, California: Consilium, Inc.

Consilium Corporate Brochure, Oct. 1999. www.consilium.com.

Consilium. "FAB300™: Consilium's Next Generation MES Solution of Software and Services which Control and Automate Real-Time FAB Operations," Jan. 1999. www.consilium.com/products/fab300_page.htm#FAB300 Introduction.

Consilium. "Increasing Overall Equipment Effectiveness (OEE) in Fab Manufacturing by Implementing Consilium's Next-Generation Manufacturing Execution System—MES II" Semiconductor Fabtech Edition 10, Jul. 1999.

Consilium. FAB300™ Update, Nov. 1999.

Cunningham, James A., "Using Electrochemistry to Improve Copper Interconnects," http://www/e-insite.net/semiconductor/index.asp?layout=article&articleid=CA47465 5 pages.

Dishon, G. M., et al., "Dielectric CMP Advanced Process Control Based on Integrated Monitoring." Ltd. Rehoveth, Israel: Nova Measuring Instruments, 11 pages, Feb. 1998.

Dishon, G., M. Finarov, R. Kipper, J.W. Curry, T. Schraub, D. Trojan, 4th Stambaugh, Y. Li and J. Ben-Jacob. Feb. 1996. "On-Line Integrated Metrology for CMP Processing." Santa Clara, California: VMIC Specialty Conferences, 1st International CMP Planarization Conference, 7 pages.

Durham, Jim, et al., "A statistical method for correlating in-line defectivity to probe yield," IEEE/SEMI Advanced Semiconductor Manufacturing conference, 1997, pp. 76-77.

Edgar, Thomas F., et al, "Automatic Control in Microelectronics Manufacturing: Practices, Challenges, and Possibilities," Automatica, vol. 36, pp. 1567-1603, 2000.

Edgar, Thomas F., et al, "Model-Based Control in Microelectronics manufacturing," Proceeding of the 38th IEEE Conference on Decision and Control, Dec. 1999, Phoenix, AZ, vol. 4, pp. 4185-4191.

EP Communication Pursuant to Article 96(2) EPC for European Patent Application No. 00115577.9, Jul. 23, 2002.

EP International Search Report prepared by the European Patent Office for PCT/US02/19062, Oct. 15, 2002.

Fang S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." International Proceedings of the IEEE Interconnect Technology Conference, pp. 76-78.

Good, Richard, et al., "Stability Analysis of double EWMA Run-to-Run Control with Metrology Delay," IEEE/CPMT International Electronic, pp. 2156-2161.

Guo, Ruey-Shan, et al. "A Cost-Effective Methodology for a Run-by-Run EWMA Controller," The 6th International Symposium on Semiconductor Manufacturing, San Francisco, Oct. 1997, pp. 61-64.

Hermann, D., "Temperature Errors and Ways of Elimination for Contactless Measurement of Shaft Vibrations (Abstract)," Technisches Messen™, vol. 55, n. 1, pp. 27-30, West Germany.

Heuberger, U., "Coating Thickness Measurement with Dual-Functional Eddy-Current & Magnetic Inductance Instrument," (Abstract), Sep. 2001, Galvanotechnik, vol. 92, No. 9, pp. 2354-2366+IV.

Hu, Albert, He Du, Steve Wong, Peter Renteln, and Emmanuel Sachs. 1994. "Application of Run by Run Controller to the Chemical-Mechanical Planarization Process." IEEE/CMPT International Electronics Manufacturing Technology Symposium, pp. 371-378.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium, pp. 126-132, 1993.

IBM Technical Disclosure Bulletin, "Electroless Plating Scheme to Hermetically Seal Copper Features," pp. 405-406, Feb. 1993., pp. 2857-2860, Oct. 1984.

IBM Technical Disclosure Bulletin, "Method to Characterize the Stability of a Step and Repeat Lithographic System," pp. 2857-2860, Oct. 1984.

IBM Technical Disclosure Bulletin, Feb. 1984. "Method and Apparatus of in Situ Measurement and Overlay Error Analysis for Correcting Step and Repeat Lithographic Cameras." IBM Technical Disclosure Bulletin, pp. 4855-4859.

IBM Technical Disclosure Bulletin, "Substrate Screening Process" pp. 4824-4825, Feb. 1984.

International Search Report prepared by the European Patent Office for PCT/US01/24910, Jul. 9, 2002.

International Search Report prepared by the European Patent Office for PCT/US01/27407, Jul. 29, 2002.

Islamraja, M. M., et al., "Two precursor model for low-pressure chemical vapor deposition of silicon dioxide from tetraethylorthosilicate," J. Vac. Sci. Technol. B 11(3), May/Jun. 1993, pp. 720-726.

Itabashi, Takeyuki, et al, "Electroless Deposited CoWB for Copper Diffusion Barrier Metal," IEEE International Interconnect Technology Conference, pp. 285-287, Jun. 2002.

Invitation to Pay Additional Fees and Communication Relating to the Results of the Partial International Search Report for PCT/US02/19116, Jul. 23, 2003.

Jensen, Alan, et al., "Empirical-Based Modeling for Control of CMP Removal Uniformity." Solid State Technology, vol. 44, No. 6, pp. 101-102, 104, 106. Cowan Publ. Corp.: Washington, D.C., Jun. 2001.

Johnson, Bob, "Advanced Process Control Key to Moore's Law," Gartner, Inc., Jun. 10, 2002, 8 pages.

Khan, S.M., et al., "Critical Dimension Control in Semiconductor Manufacturing,"(Abstract), ANNIE 2000, Smart Engineering Systems Design Conference, pp. 995-1000, St. Louis, Missouri.

Khan, Kareemullah, et al., 1998. "Run-to-Run Control of ITO Deposition Process." Ann Arbor, Michigan, 1998, 6 pages.

Khan, K. C., et al., "Yield Improvement at the Contact Process Through Run-to-Run Control," (Abstract), 24th IEEE/CPMT Electronics Manufacturing Technology Symposium, pp. 258-263.

Kim, Eui Jung, et al., "Analytical Model Chemical Vapor Deposition of SiO2 films using tetraethoxysilane and ozone," Journal of Crystal Growth, vol. 140, Issues 3-4, Jul. 1994, pp. 315-326, (abstract only).

Kim, Jiyoun, et al. "Gradient and Radial Uniformity Control of a CMP Process Utilizing a Pre- and Post- Measurement Strategy."

KLA-Tencor Corporation, 2002, "KLA Tencor: Press Release: KLA-Tencor Introduces First Production-Worthy Copper CMP In-Situ Film Thickness and End-point Control System: Multi-Million Dollar Order Shipped to Major CMP Tool Manufacturer," www.kla-tencor.com/new_events/press_releases2001/984086002.html. 1 page.

Kurtzberg, Jerome, M., "ABC: A Better Control for Manufacturing," IBM Journal of Research and Development, vol. 38, No. 1, pp. 11-30, Jan. 1984.

Klein, Bruce. Jun. 1999. "Application Development: XML Makes Object Models More Useful." InformationWeek, pp. 1A-6A.

Kuo, W.W. Adaptive in-line Sampling Strategies for Semiconductors Manufacturing, ESRC 96-35, and CSM-35. Jan. 1997 (abstract only).

Kuo, et al., "Effective In-Line Defect Monitoring with Variable Wafer Area Covverage," IEEE/SEMI Advance Semicondcutor Manufacturing Conference, 1997, pp. 289-293.

Larrabee, G.B., "The Intelligent Microelectronics Factory of the Future (Abstract)," IEEE/SEMI International Semiconductor Manufacturing Science Symposium, pp. 30-34, Burlingame, CA May 1991.

Leang, Sovarong, et al, "A Control System for Photolithographic Sequences," IEEE Transactions on Semiconductor Manufacturing, vol. 9, No. 2, May 1996, pp. 191-207.

Lee, Brian et al., "Wafer Nanotopography Effects on CMP: Experimental Validation of Modeling Methods." San Francisco, California: Materials Research Society Spring Meeting, Apr. 2001, 6 pages.

Leighton, "Contactless Bulk Sensitivity/Sheet Resistance Measurement and Mapping Systems," www.Lehighton.com/fabtech1/index.html.

Levine, Martin D., "Vision in Man and Machine," New York: McGraw-Hill, Inc., 1985, pp. ix-xii, 1-58, 1985.

Lin, Kuang-Kuo, et al., "Statistical Equipment Modeling for VLSI Manufacturing: an Application for LPCVD," IEEE Transactions on Semiconductor Manufacturing, vol. 4, No. 1, pp. 43-51.

Matsuyama, Akira, et al., "A State-of-the-Art Automation System of an ASIC Wafer Fab in Japan," IEEE/SEMI International Semiconductor Manufacturing Science Symposium, pp. 42-47, 1993.

McIntyre, M., et al., "Key Considerations in the Development of Defect Sampling Methodologies". ASMC 96 Proceedings, IEEE/SEMI 1996 (Nov. 1996); pp. 81-85.

McIntosh, John, "Using CD-SEM Metrology in the Manufacture of Semiconductors," (Abstract), JOM, vol. 51, No. 3, Mar. 1999, pp. 38-39.

Meckl, P.H., et al., "Achieving Fast Motions in Semiconductor Manufacturing Machines," (Abstract), Proceedings of the 1999 IEEE International Conference on Control Applications, vol. 1, pp. 725-729, Kohala Coast, HI.

Meckl, P.H., et al., "Achieving Fast Motions by Using shaped Reference Inputs," [Semiconductor Manufacturing Machine, (Abstract), NEC Research and Development, vol. 41, No. 2, pp. 232-237.

Miller, G. L., "Contactless Measurement of semiconductor Conductivity by Radio Frequency-Free-Carrier Power Absorption," Rev. Sci. Instrum.., vol. 47, No. 7, pp. 799-805.

Moyne, James, "Adaptive Extensions to a Multi-Branch Run-To-Run Controller for Plasma Etching," Journal of Vacuum Science and Technology, Ann Harbor, Michigan: University of Michigan Display Technology Manufacturing Center, 1995, 12 pages.

Moyne, James, "Advancements in CMP Process Automation and Control," Hawaii: (Invited paper and presentation to Third International Symposium on Chemical Mechanical Polishing in IC Device Manufacturing: 196th Meeting of the Electrochemical Society, Oct. 1999, 13 pages.

Moyne, James, et al., "A Fully Automated Chemical-Mechanical Planarization Process." Santa Clara, California: VLSI Multilevel Interconnection (V-MIC) Conference, Jun. 1998, 4 pages.

Moyne, James, et al., "A Process-Independent Run-to-Run Controller and Its Application to Chemical-Mechanical Planarization." SEMI/IEEE Advanced Semiconductor Manufacturing Conference and Workshop. Ann Arbor, Michigan: The University of Michigan, Electrical Engineering & Computer Science Center for Display Technology & Manufacturing, Aug. 1995, pp. 194-200.

Moyne, James, et al., "Development and Development of a Multi-Component Advanced Process Control System for an Epitaxy Tool," (Abstract), 2002 IEEE Advanced Semiconductor Manufacturing Conference and Workshop pp. 125-130.

Muller-Heinzerling, Thomas, et al., "Recipe-Controlled Operation of Batch Processes with Batch X," ATP Automatisierungstechnisch Praxis, vol. 36, No. 3, pp. 43-51, Mar. 1994. (Abstract only).

Mullins, J.A., et al., An Evaluation of Model Predictive Control in Run to Run Processing in Semiconductor Manufacturing, (Abstract), Proceedings of the SPIE The International Society for Optical Engineering conference, vol. 3213, pp. 182-189, Oct. 1997.

Mozumder, Purendu K., et al., "Statistical Feedback Control of a Plasma etch Process," IEEE Transactions on Semiconductor Manufacturing, vol. 7, No. 1, pp. 1-11, Feb. 1994.

NovaScan 2020, "Superior Integrated Process Control for Emerging CMP High-End Applications," Feb. 2002.

Nurani, et al., "The Impact of Lot-to-Lot and Wafer-to-Wafer Variations on SPC," IEEE (1997): 69-72.

Oechsner, R.T., et al., "Feed-Forward Control for a Lithography/Etch Sequence," (Abstract), Proceedings of the SPIE- The International Society for Optical Engineering Conference, vol. 4182, pp. 31-39.

Ostanin, Yu ya, "Optimization of Thickness Inspection of Electrically Conductive Single-layer Coatings with Laide-on-Eddy-Current Transducers (Abstract)," Defektoskopiya, vol. 17, No. 10, pp. 45-52. Moscow, USSR.

Ouma et al., "An Integrated Characterization and Modeling Methodology for CMP Dielectric Planarization", Proc. of Interconnect Technology Conference, Feb. 1998, pp. 67-69.

Pan, Tony J., et al., "Copper CMP Integration and Time Dependent Pattern Effect," IEEE 1999 International Interconnect Technology Conference, May 1999, pp. 164-166.

PCT International Search Report for PCT/US01/22833, Oct. 4, 2002.
PCT International Search Report for PCT/US01/24910, Oct. 23, 2003.
PCT International Search Report for PCT/US01/27406, Oct. 23, 2002.
PCT International Search Report for PCT/US02/19061, Nov. 12, 2002.
PCT International Search Report for PCT/US02/19063, Nov. 12, 2002.
PCT International Search Report or Declaration for PCT/US02/19116, dated Oct. 20, 2003, (BSTZ No. 8090P010PCT).
PCT Written Opinion for PCT/US02/19116, dated Apr. 9, 2004, (BSTZ No. 8090P010PCT).
PCT International Preliminary Examination Report for PCT/US02/19116, dated Aug. 18, 2004. (BSTZ No. 8090P010PCT).
PCT International Search Report for PCT/US02/19117, Nov. 11, 2002.
PCT International Search Report for PCT/US02/21942, Oct. 14, 2003.
PCT International Search Report for PCT/US02/24859, Mar. 25, 2003.
PCT International Search Report for PCT/US03/08513, Aug. 8, 2003.

PhaseShift.com, "3D Optical Profilometer MicroXAM by ADE Phase Shift," http://www.phase-shift.com/microxam.shtml.

PhaseShift.com, "NanoMapper FA Factory Automation Wafer Nanotopography Measurement," http://www.phase-shift.com/nanaomapperfa.shtml.

PhaseShift.com, "NanoMapper Wafer Nanotopography Measurement by ADE Phase Shift," http://www.phase-shift.com/nanaomap.shtml. 3 pages.

PhaseShift.com, "Wafer Flatness Measurement of Advanced Wafers," http://www.phase-shift.com/wafer-flatness.shtml 4 pages.

Pilu, Maurizio, "Undoing Page Curl Distortion Using Appliance Surfaces," IEEE International Conference on Image Processing, Sep. 2001, Thessalonica Greece, pp. 237-240.

Nurani, et al. "The Impact of Lot-to-Lot and Wafer-to-Wafer Variations on SPC." IEEE (1997): 69-72.

Rampalli, Prasad, et al., CEPT-A Computer-Aided Manufacturing Application for Managing Equipment Reliability and Availability in the Semiconductor Industry. New York, New York: IEEE, 1991, pp. 499-506.

Rauf. S.; Kushner, M.J.,Semiconductor Manufacturing, IEEE, "Virtual plasma equipment model: a tool for investigating feedback control in plasma processing equipment," Transactions on vol. 11, Issue 3, Date: Aug. 1998, pp. 486-494.

Rauf, Shahid and Mark J. Kushner. "Controller design issues in the feedback control of radio frequency plasma processing reactors." American Vacuum Society, pp. 704-712, Jun. 1999.

Ravid, Avi, et al., "Copper CMP Planarity Control Using ITM," IEEE/SEMI Advanced Semiconductor Manufacturing Conference, pp. 437-443, 2000.

Reitman, E.A., D.J. Friedman, and E.R. Lory, "Pre-Production Results Demonstrating Multiple-System Models for Yield Analysis," (Abstract) Nov. 1997, IEEE Transactions on Semiconductor Manufacturing, vol. 10, No. 4, pp. 469-481.

Ruegseggger, Steven, et al., "Feedforward Control for Reduced Run-to-Run Variation in Microelectronics Manufacturing," IEEE Transactions on Semiconductor Manufacturing, Oct. 1999, vol. 12, No. 4, pp. 493-502.

Runyan, W.R., et al., "Semiconductor Integrated Circuit Processing Technology." p. 22-52. Reading, Massachusetts: Addison-Wesley Publishing Company, 1990, pp. 22-52.

Sarfaty, Moshe, et al., "Advance Process Control Solutions for Semiconductor Manufacturing," IEEE/SEMI Advanced Semiconductor Manufacturing Conference, pp. 101-106, Apr./May 2002.

Scarr, J.M., et al., "New topology for Thickness Monitoring Eddy current Sensors (Abstract)," Proceedings of the 36th annual Technical Conference, Dallas, TX, Apr. 1993, pp. 228-231.

Schaper, C. D., et al., "Modeling, Identification, and Control of Rapid Thermal Processing Systems (Abstract)," Journal of the Electrochemical Society, vol. 141, No. 11, pp. 3200-3209.

Schmid, Hans Albrecht, "Creating the Architecture of a Manufacturing Framework by Design Patterns." Austin, Texas: OOPSLA, 1995, pp. 370-384.

Semiconductor FABTECH, "Motorola and Advanced Micro Devices Buy ObjectSpace Catalyst Advanced Process Control Product for Five Wafer Fabs." Jul. 5, 2001 www.semiconductorfabtech.com/industry.news/9907/20.07.shtml 2 pages.

"Semiconductor Manufacturing: An Overview," http://users.ece.gatech.edu/gmay/overview.html. 23 pages.

SEMI. [1986] 1996. "Standard for Definition and Measurement of Equipment Reliability, Availability, and Maintainability (RAM)." SEMI E10-96, pp. 1-23.

SEMI. 2000. "Provisional Specification for CIM Framework Scheduling Component." San Jose, California. SEMI E105-1000, pp. 1-18.
SEMI. Jul. 1998. New Standard: Provisional Specification for CIM Framework Domain Architecture. Mountain View, California: SEMI Standards. SEMI Draft Doc. 2817, pp. 1-41.
Shindo, Watru, et al.; "Excursion detection and source isolation in defect inspection and classification", 2nd Int. Wksp. On Statistical Metrology; pp. 90-93; Jun. 1997.
Smith, Taber, Duane Boning, James Moyne, Arnon Hurwitz, and John Curry. Jun. 1996. "Compensating for CMP Pad Wear Using Run by Run Feedback Control." Santa Clara, California: Proceedings of the Thirteenth International VLSI Multilevel Interconnection Conference. pp. 437-439.
Smith, T., and D. Boning, "A Self-Tuning EWMA Controller Utilizing Artificial Neural Network Function Approximation Techniques," accepted for presentation, IEEE Int'l Electronics Manufacturing Technology Symposium, Austin, TX, Oct. 1996, pp. 355-363.
Smith, Stewart, et al., "Evaluation of Sheet Resistance and Electrical Linewidth Measurement Techniques for copper Damascene Interconnect," IEEE Transactions on Semiconductor Manufacturing, vol. 15, No. 2, pp. 214-222, May 2002.
Sonderman, Thomas, "APC as a Competitive Manufacturing Technology: AMD's Vision for 300mm." AEC/APC, 2002, 46 pages.
Souza, Adriano Mendonça, et al., "How to use EWMA to Achieve SPC and EPC Control," Nov. 1999 International Symposium on NDT Contribution to the Infrastructure Safety Systems, Tores Brazil (abstract only), pp. 270-277.
Spanos, Costas, J., "A Multistep Supervisory Controller for Photolithographic Operations (Abstract)," Proceeding of the Symposium on Process Control, Diagnostics, and Modeling in Semiconductor Manufacturing, pp. 3-17, May 1995.
Spanos, Costas, J., "Real-time Statistical Process Control using Tool Data," IEEE Transactional on Semiconductor Manufacturing, vol. 5, No. 4, pp. 308-318, Nov. 1992.
Stoddard, K. P., et al., "Application of Feedforward and Adaptive Feedback Control to Semiconductor Device Manufacturing (Abstract)," Proceedings of the 1194 American Control Conference-ACC '94, vol. 1, pp. 892-896, Baltimore, Maryland, 1994.
Sun, S.C., "CVD and PVD Transition Metal Nitrides as Diffusion Barriers fo Cu Metallization," 1998, IEEE, pp. 243-246.
Suzuki, Junichi and Yoshikazu Yamamoto. 1998. "Toward the Interoperable Software Design Models: Quartet of UML, XML, DOM and CORBA." Proceedings IEEE International Software Engineering Standards Symposium, pp. 1-10.
Takahashi, Shingo, et al., "Fragile Porous Low-k/Copper Integration by Using Electro-Chemical Polishing," 2002 Symposium on VLSI Digest of Technical Papers, pp. 32-33.
Tan, K.K., et al., "Precision Motion Control System for Ultra-Precision Semiconductor and Electronic Components Manufacturing," (Abstract), 51st Electronic Components and Technology Conference 2001. Proceedings, pp. 1372-1379, Orlando, Florida.
Tao, K. M., "Feedforward Learning Applied to RTP of Semiconductor Wafers (Abstract)," Proceeding of the 33rd IEEE Conference on Decision and Control, vol. 1, pp. 67-72, Lake Buena Vista, FL, Dec. 1994.
Tobin, K.W, et al., "Field Test Results of an Automated Image Retrieval System," (Abstract) Advanced Semiconductor Manufacturing Conference, 2001 IEEE/SEMI, Munich, Germany, pp. 167-174.
Telfeyan, Roland, et al, "A Multi-Level Approach to the Control of a Chemical-Mechanical Planarization Process." Minneapolis, Minnesota: 42nd National Symposium of the American Vacuum Society, Oct. 1995, 20 pages.
Van, Zant, Peter. 1997. Microchip Fabrication: a Practical Guide to Semiconductor Processing. Third Edition, pp. 472-478. New York, New York: McGraw-Hill, 1997, pp. 463-489.

Wang, LiRen, et al., "A Novel NN=Fuzzy-SPC Feedback Control System," 8th IEEE International Conference on Emerging Technologies and Factory Automation, pp. 417-423.
Williams, R., et al.: "Optimized Sample Planning for Wafer Defect Inspection" Semiconductor Manufacturing Conference' Proceedings, 1999 IEEE International Symposium on Santa Clara, CA, Piscataway, NJ, Oct. 1999, pp. 43-46.
Written Opinion for PCT/US01/24910, May 23, 2003.
Written Opinion for PCT/US01/27406, Aug. 1, 2003.
Written Opinion for PCT/US01/22833, Aug. 20, 2003.
Yasuda, M., T. Osaka, and M. Ikeda. Dec. 1996. "Feedforward Control of a Vibration Isolation System for Disturbance Suppression (Abstract)." Proceeding of the 35th IEEE Conference on Decision and Control, vol. 2, pp. 1229-1233. Kobe, Japan.
Yeh, C., et al., "Implementation Challenges of a Feedback Control System for Wafer Fabrication," IEEE Internation Semiconductor Manufacturing Technology Symposium, pp. 438-442, 1993.
Zhe, N., et al., "A Comparative Analysis of Run-to-Run Control Algorithms in the Semiconductor Manufacturing Industry," IEEE/SEMI 1996 Advanced Semiconductor Manufacturing Conference & Workshop, pp. 375-381, New York, 1996.
Zhou, Zhen-Hong and Rafael Reif. Aug. 1995. "Epi-Film Thickness Measurements Using Emission Fourier Transform Infrared Spectroscopy-Part II: Real-Time in Situ Process Monitoring and Control." IEEE Transactions on Semiconductor Manufacturing. vol. 8, No. 3, Aug. 1995, pp. 340-345.
Zorich, Robert, 1991. Handbook of Quality Integrated Circuit Manufacturing, San Diego, California: Academic Press, Inc., pp. 464-498.
Notice of Allowance for U.S. Appl. No. 10/135,451, mailed Nov. 16, 2009.
Office Action for U.S. Appl. No. 10/135,451, mailed Apr. 6, 2006.
Office Action for U.S. Appl. No. 10/135,451, mailed Jul. 27, 2009.
Office Action for U.S. Appl. No. 10/135,451, mailed Jan. 30, 2009.
Office Action for U.S. Appl. No. 10/135,451, mailed Aug. 14, 2008.
Office Action for U.S. Appl. No. 10/135,451, mailed Mar. 17, 2008.
Office Action for U.S. Appl. No. 10/135,451, mailed Sep. 28, 2007.
Office Action for U.S. Appl. No. 10/135,451, mailed Dec. 20, 2006.
Office Action for U.S. Appl. No. 12/006,328, mailed Sep. 10, 2009.
Applied Materials Software Office Action for U.S. Appl. No. 09/943,955 mailed May 5, 2004.
Applied Materials Software Office Action for U.S. Appl. No. 09/943,955 mailed Dec. 30, 2004.
Applied Materials Software Office Action for U.S. Appl. No. 09/943,955 mailed Jul. 26, 2005.
Applied Materials Software Office Action for U.S. Appl. No. 09/943,955 mailed Jan. 31, 2006.
Applied Materials Software Notice of Allowance for U.S. Appl. No. 09/943,955 mailed Sep. 11, 2006.
Applied Materials Software Office Action for U.S. Appl. No. 11/645,989 mailed Nov. 14, 2008.
Applied Materials Software Office Action for U.S. Appl. No. 11/645,989 mailed Jun. 9, 2009.
Office Action for U.S. Appl. No. 10/174,377, mailed Aug. 2, 2004.
Office Action for U.S. Appl. No. 10/174,377, mailed Feb. 25, 2005.
Office Action for U.S. Appl. No. 10/174,377, mailed Sep. 7, 2005.
Office Action for U.S. Appl. No. 10/174,377, mailed May 31, 2006.
Office Action for U.S. Appl. No. 11/701,401 mailed Feb. 5, 2009.
Office Action for U.S. Appl. No. 11/701,401 mailed Aug. 7, 2009.
Notice of Allowance for U.S. Appl. No. 12/006,328, mailed Jan. 13, 2010. (P010D3).
Applied Materials Software Office Action for U.S. Appl. No. 11/645,989 (P019D) mailed Oct. 5, 2009.
US 6,150,664, 11/2000, Su (withdrawn)

* cited by examiner

DYNAMIC METROLOGY SCHEMES AND SAMPLING SCHEMES FOR ADVANCED PROCESS CONTROL IN SEMICONDUCTOR PROCESSING

RELATED APPLICATION

This application is a divisional of U.S. patent application Ser. No. 10/135,451, filed May 1, 2002, which claims the benefit of U.S. Provisional Application Ser. No. 60/322,459, filed Sep. 17, 2001, which is expressly incorporated herein by reference; and U.S. Provisional Application Ser. No. 60/298,878, filed Jun. 19, 2001, which is expressly incorporated herein by reference.

BACKGROUND OF THE INVENTION

1. Field of the Invention

The present invention concerns computer-related and/or assisted methods, systems and computer readable mediums for metrology during process control. More specifically, it relates to dynamic adjustment of metrology schemes and sampling during advanced process control methods, for example during control of semiconductor technology manufacture.

2. Related Art

In the wafer fabrication art, measurements are made by metrology tools on wafers as they are being manufactured by processing devices, in order to ensure that the wafers are produced according to a predefined specification. The measurements are made of physical properties such as film thickness and uniformity, dopant concentration, gate length and critical dimension. This is known as the science of "metrology."

Measurements to be made are typically specified in a "die map". The die map indicates where the different chips (or die) are located on a wafer (in the typical situation where multiple chips are formed on and eventually cut from a single wafer), as well as significant locations, such as corners, on each die. In order to measure the right hand corner on each die, for example, multiple points are measured on the wafer in accordance with the die map. Ordinarily a die map is a digital representation of coordinate points, or "metrology coordinates," on the wafer.

The metrology coordinates are usually provided by an engineer, and vary depending on the engineer's preferences. Metrology coordinates are conventionally provided as x, y coordinates.

A "sampling plan," alternatively referred to as a "metrology plan," contains metrology coordinates drawn from the die map. The sampling plan denotes a specific plan for taking certain measurements. These measurements may include some or all of the possible points and/or chips in the die map.

A conventional metrology system assigns a sampling plan that predetermines which wafers are to be measured in connection with a processing device, and the measurements which are to be taken of those wafers by the metrology tool. For example, the sampling plan might define that each fifth wafer should be measured at pre-designated locations. These sampling plans are not changed after being initially assigned, and hence the metrology systems are static.

Unfortunately, manufacturing results tend to drift away from the intended target or specification when there is a change in the manufacturing process, such as a change in recipe, preventative maintenance, consumables change, environmental change or a new lot of wafers. Conventional metrology systems tend to miss some wafers which are outside specification limits, since these systems use a virtually consistent measurement scheme, having consistently frequent measurements with consistent spatial resolution, without taking into consideration whether any changes were introduced into the manufacturing process which might change the manufacturing results.

Manufacturing systems do not typically call for a measurement of every wafer, since measuring takes time and increasing the number of measurements results in a decrease of productivity. On the other hand, measuring fewer wafers tends to lead to delayed detection of critical information for process control that may significantly impact wafer yield. While conventional sampling systems will sample wafers during and/or after production, these systems do not adjust the initially assigned sampling plan for the wafers during production.

Thus, there remains a need for dynamic metrology to improve the quality of products. For semiconductor wafers, there remains a need to better check whether each specification is met under production conditions. There also remains a need to respond to a change in parameters which may cause a variance from intended target results, such as recipe parameters, and to adjust the frequency and/or spatial resolution of measurements. Unfortunately, taking measurements takes time, and most processing devices are faster than the measurements that need to be taken by metrology tools in order to characterize the wafers using a metrology. Thus, there remains a need for a method, system and medium to react to changes potentially affecting the system results, and to appropriately adjust, increase, or decrease the measurements accordingly.

SUMMARY OF THE INVENTION

The present invention alleviates the problems of the conventional techniques described above by dynamically determining whether a wafer needs to be measured for process control based on changes in the resources, recipes, etc. In addition, for a given wafer to be measured, measuring points are also dynamically assigned to the metrology tool.

More specifically, two variations of embodiments of the present invention are contemplated and may be used independently or together. According to the first variation, the frequency at which wafers are measured ("wafer-to-wafer") is adjusted, following an event that suggests that more (or fewer) wafers should be measured. According to the second variation, the spatial resolution of the measurements of those wafers selected for measurement ("within-wafer") is increased or decreased, following an event that suggests each wafer which is measured should be measured in greater (or lesser) detail.

In one or more embodiments of the present invention, candidate coordinate measurement points are mapped in a die map, and a subset of the candidate coordinate measurement points are selected as the initial points where measurements are to be made. Subsequently, according to the within-wafer variation, the invention dynamically selects more, fewer or different points (depending on the circumstances) to be measured from among the candidate coordinate measurement points. According to the wafer-to-wafer variation, when there is a change in the manufacturing process, the number of measurements may be increased, to measure every wafer rather than just every third wafer for example. As one example, when a new recipe is implemented to significantly change the thickness at a particular region on the wafer, a greater number of within-wafer measurements can be made at that location by selecting more and/or different candidate measurement points. As another example, when a fault is detected, the frequency of wafers selected for measurement is increased; this increases the probability of detecting defectively manufactured wafers and correcting the control parameters (such as in connection with a feed forward/feedback method). In some situations, large deviations may require less frequent measurement or less spatial resolution than small deviations when the large deviations clearly identify the problem, whereas small deviations may be difficult to identify and more frequent and/or dense measurements may be necessary. The reverse may be appropriate in other situations regarding the frequency and density of measurements, or it may be the case that the same number of measurements may be taken regardless of deviation.

According to one or more embodiments of the present invention, there is provided a method, system and/or computer-implemented method for measuring at least one manufacturing characteristic for at least one product manufactured by a manufacturing process. Information is provided, representative of a set of candidate points to be measured by the manufacturing process on the at least one product. The manufacturing process executes a plan for performing measurements on the at least one product to measure the at least one manufacturing characteristic, the plan defining the measurements to be made responsive to the set of candidate points. A change in the manufacturing process is detected, the change including at least one of: receiving new material in the manufacturing process, detecting a fault in the manufacturing process, detecting a change in a control parameter in the manufacturing process, and detecting a variation in a measurement of the at least one product.

According to one or more embodiments, the plan for performing measurements is adjusted based on the detected change and at least one additional measurement is performed responsive thereto.

According to one or more embodiments, the measurements of the plan are adjusted wafer-to-wafer and/or within-wafer.

According to one or more embodiments, the product is a semi-conductor wafer and the manufacturing process is an automated semi-conductor manufacturing process.

According to one or more embodiments, the plan further includes information representative of a metrology recipe.

According to one or more embodiments, the candidate points are included in a map corresponding to the at least one product. The plan may be a pre-determined sampling plan.

According to one or more embodiments, the plan defines at least one region on the product, each of the candidate points corresponding to the at least one region.

According to one or more embodiments, the adjustment includes determining the at least one region corresponding to the detected change, selecting the at least one additional measurement responsive to the candidate points corresponding to the determined region, assigning the selected at least one additional measurement to be performed under the plan, and revising at least one of the measurements, the additional measurement and the plan. The adjustment may include determining whether the detected change may affect a series of products, and if so, determining whether to measure at least one of the products in the series of products. The products may be provided in a group, and the plan may further include first information representative of the products in the group that are available to be measured, and second information representative of the products in the group that are to be measured under the plan.

According to one or more embodiments, information representative of measurement results on the product is discarded when the measurements results indicate a variation in measurement of the product and/or when a fault is detected in the manufacturing process.

According to one or more embodiments, the sampling plan includes a plurality of splines radiating from a center of a product, and the candidate points are distributed along the splines. The distribution of the candidate points along the splines may be weighted according to a surface area of the product. According to one or more other embodiments, the sampling plan includes a plurality of radially distributed candidate points.

BRIEF DESCRIPTION OF THE FIGURES

The above mentioned and other advantages and features of the present invention will become more readily apparent from the following detailed description in the accompanying drawings, in which.

DETAILED DESCRIPTION

Figure 1:
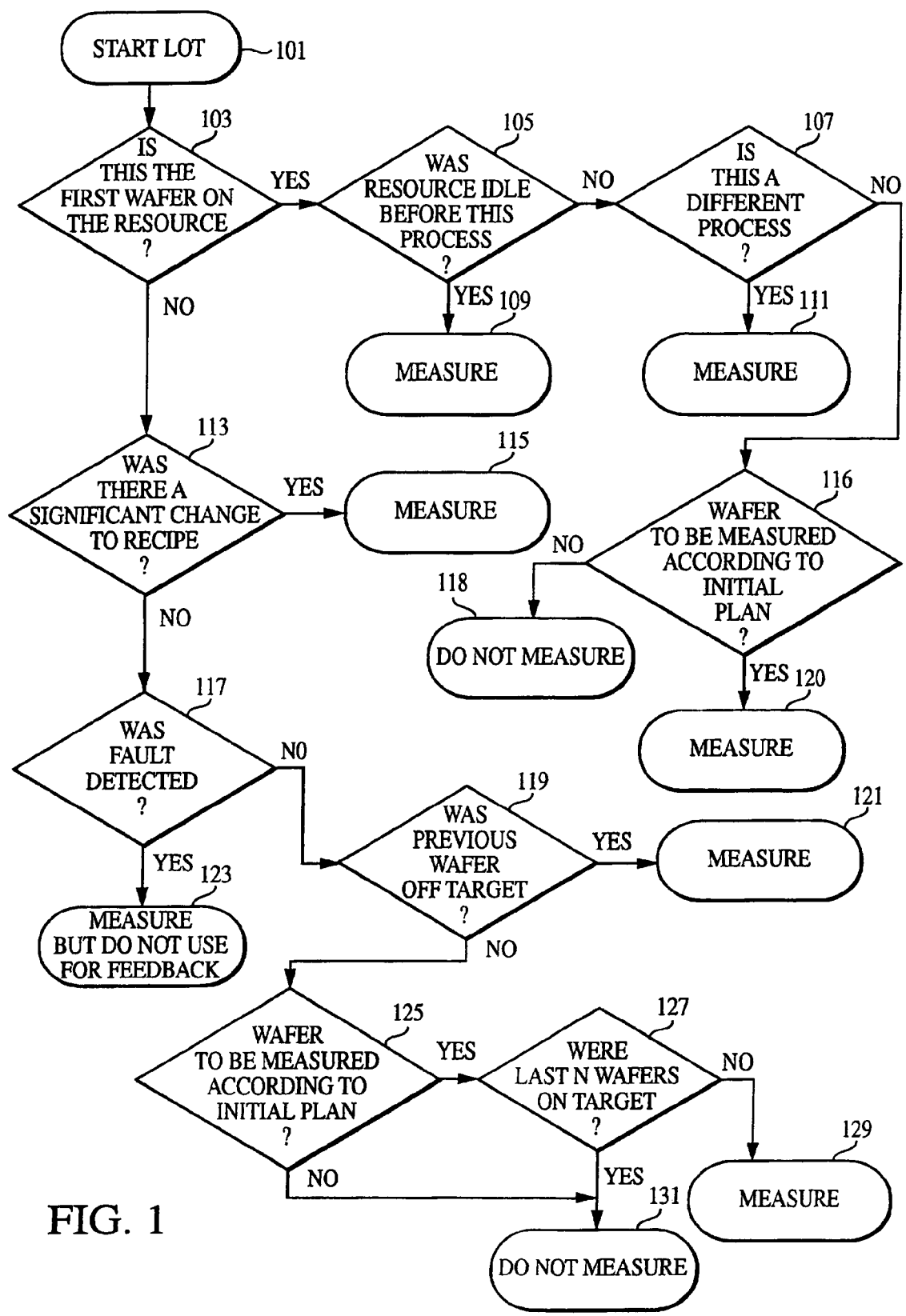
FIG. 1 is a flow chart showing one example of dynamic metrology for "wafer-to-wafer" processing in the present invention.

The following detailed description includes many specific details. The inclusion of such details is for the purpose of illustration only and should not be understood to limit the invention. Throughout this discussion, similar elements are referred to by similar numbers in the various figures for ease of reference. In addition, features in one embodiment may be combined with features in other embodiments of the invention.

In one or more embodiments of the present invention, static metrology means there is a pre-determined sampling plan in connection with a wafer (or other device) to be measured, specifying substantially the same points for each wafer (or the other device). In contrast, a dynamic metrology plan utilizes an initial sampling plan and adjusts the sampling responsive to certain events or non-events. As an example of an adjustment due to a non-event, if the last ten wafers measured are all the same, and if the processing device did not change, and if the recipe on the processing device did not change, one could reasonably assume that the next series of wafers will have measurements that are also all the same. That being the case, then in order to increase throughput and decrease the time it takes to do measurements, the invention provides for dynamically adjusting the measurements, for example, such that every third wafer instead of every wafer is measured. This invention thus detects and adjusts for not only potential errors, which could arise for example upon a recipe change, but also for accuracy.

One or more embodiments of the present invention contemplate that the invention may be used in connection with water-to-wafer measurements described above, as well as, or alternatively, in connection within-wafer measurements. Consider an example of within-wafer measurements, in which measurements are taken along a radius of a 200 mm diameter wafer and the radius is measured in 10 mm increments. During processing it is noted or detected by the usual detection process that there is a large variation at the 50 mm and 60 mm points. For the next sample, the system adjusts to measure another point from the sampling plan between 50 mm and 60 mm to better characterize that variation, or optionally to measure an additional point, for example, between 40 mm and 50 mm that is near the location of the variation. If the die map includes points at 45 mm and 55 mm, these points can then be added as measurement points. Adjusted measurements now encompass in this example, 40 mm, 45 mm, 50 mm, 55 mm, and 60 mm. The system dynamically added the two additional points (in the example) to better characterize the measurement and/or the variation. Where there are provided a number of candidate points in the die map allowing points to be added or substituted, the system can select among the points any of several ways, such as selecting the closest to mean, mode, other statistical analysis, etc.

A sampling plan provides specific measure points within a die, a die being the section on the wafer that will typically eventually become a single chip after processing. There are specified points within the die that are candidates for measuring. The map of the die is stored, preferably in an electronic format representing the map. One appropriate place for storing the die map information is in the factory automation system ("MES" or manufacturing execution system). The stored die map information may be advantageously retrieved and translated to determine the available points for measurement on the wafer. Referring back to the previous example proposing measurement points on the radius at 45 mm and 55 mm, if these specific points are not relevant to the current die (e.g., they are not specified by the die map), an appropriate replacement would be points selected from the candidate points specified by the die map which are close to or between 45 mm and 55 mm. Those points could be selected dynamically as well. Other criteria may be used for selecting points as well.

Dynamic metrology is performed to better meet a certain specification. For example, if recipe parameters are changed on the processing device, to adjust the thickness of a film that is deposited on the wafer, it may be desirable to more closely check whether the specification is still being achieved by performing measurements.

In order to avoid slowing down the process, one or more embodiments of the present invention advantageously determine the appropriateness of performing additional measurements when one or more events occur that are likely to indicate an internal or external change affecting the manufacturing process or results. The increase in measurements and possible corresponding decrease in processing occur on an as-needed basis and/or based on predetermined criteria.

The wafer-to-wafer variation of the invention, for example, can check for events which may affect a series of wafers and may adjust the sampling plan. For example, during processing, the system determines if an increase is needed in the frequency of wafers measured for process control, for example, based on—1) a change in the processing device the wafers are processed on, 2) a change in the parameters or recipe that were used by the processing device to process the wafer, 3) large detected variations or errors in measurements, and/or 4) a significant run of wafers without errors.

Particularly regarding within-wafer variation, one or more embodiments of the present invention contemplate that the system obtains a stored die map with metrology coordinate information from the MES. As indicated, the system can provide not only for assigning the measurement points optionally dynamically, but also for de-assigning.

One or more embodiments of the present invention envision changing the sampling plan using information that is gathered from the MES and automatically using that new sampling plan, depending on, for example the type of processing device on which the wafers are processed. Advantageously, the system has stored information about a wafer that indicates, among other things, the type of chip or type of device and an associated sampling plan to be used when measuring a wafer containing a specific device. Based on the type of device, the associated sampling plan or die map can be obtained, where the die map includes a set of candidate metrology points. The system then selects metrology points for the current wafer from the set of, or responsive to, the candidate points in the die map.

With respect to the sampling plan, generation of the sampling plan can vary from device to device (chip type to chip type) and some measurements may be based on die distribution on the wafer. By dividing a wafer into regions and using regions of the wafer for measurement, one or more embodiments of the present invention provide flexibility in selecting one or more points from available points in the region. Use of regions is one way to provide a pool of candidate points, from which the system may select points that are most relevant to the desired information about the film on the wafer.

In practice, the system may, for example, measure twenty-two to twenty-five points per wafer from the pool of candidate points. For some processes the system might measure fewer points, such as eight points, because it takes longer to measure those points or the wafer-processing time-is faster. For other processes the system might measure one point of another type of property, such dopant concentration, which is a relatively slow measurement.

In any event, it is important to balance the time consumed in a measurement against the need to produce quality products. Manufacturers consider it to be more important to be within specifications and not produce defective product, than to rapidly produce product of suspect qualities.

Each processing device on which a wafer is processed has a different processing time, and therefore the selected standard sampling rate may depend on the speed of processing of the processing device and metrology tool. On some processing devices, measurements on every wafer will not slow down processing since the speed of the processing device is slower than the measurements by the metrology tool. For example, polishing and cleaning processing devices may consume five minutes or more to process a wafer. In that case a post-processing measurement by the metrology tool on every wafer would often not reduce throughput.

Additionally, the system may determine whether or not to make additional measurements based on the initial and the final condition of the wafers. For example, if there is a situation in which the incoming thickness profile of a cross section of a wafer does not change very much, the system may reduce the frequency of samples of incoming profiles, wafer-to-wafer. On the other hand, if the incoming profile is changing significantly, it may be desirable to measure every entering wafer.

Reference is made to FIG. 1, illustrating an example of a flow chart for one or more embodiments of a wafer-to-wafer dynamic metrology system. The system checks whether there may have been a significant change in the state of the processing device, which can be detected by checking, for example, idle time, change of consumables, etc. There may be other events that could be checked that would indicate a potential change in the processing device or lead one to believe that it might have been changed. It is possible that the processing device itself may include sufficient programming to recognize or track those type of events. The flowchart example in FIG. 1 includes an example set of events or state changes that initiate analysis and decision-making, based upon information gathered from the processing device and based on a significant internal or external change (e.g., system was idle for a long time, chamber was cleaned, new batch of slurry, initial wafer, etc.). Other events or states may be included in the set from which it is determined whether or not to measure a wafer.

One or more embodiments, of the present invention also envision the following. Assume that there is provided an initial sampling plan. The plan could, for example, direct measuring of specific points on each wafer and/or comprise information indicating which wafers within the lot will be measured. The wafer is measured according to the sampling plan. According to the wafer-to-wafer metrology plan, the system deviates from the initial sampling plan when warranted. The system could return to the initial sampling plan once it detects that the process is again "normal" or again producing product within specification.

Referring still to FIG. 1, consider for example a typical cassette of twenty-five wafers to be processed according to one or more embodiments of the present invention. The cassette of wafers arrives at the processing device, usually from some other processing device, and processing on the lot is started, at block 101.

If a wafer being processed by a processing device is the first wafer of a particular lot on the processing device then it may be desirable to measure this wafer, in order to detect if perhaps there was some processing device related property that changed. Thus, at block 103, the system checks whether it is processing the first wafer on the resource. This could also include situations such as following preventative maintenance where the chamber in the processing device has been cleaned or perhaps a consumable was replaced in the processing device.

If a processed wafer was the first (or other predetermined) wafer on the resource in accordance with block 103, then the system checks at block 105 whether the processing device was idle, greater than some specified time before starting the present process; and if the processing device was not significantly idle, the system checks at block 107 whether the process was changed or altered. If the process was not changed, a measurement of the wafer may or may not be-implemented according to the initial sampling plan at block 116 the wafer-is accordingly measured at block 120 or not measured at block 118. On the other hand, if the resource was idle for a sufficiently long time, or if the process has changed, at blocks 109 or 111 respectively, a new measurement is taken.

If the wafer was not the first one on the processing device, then as indicated, at block 113, the system checks whether a significant change was made to the recipe, such as by the process control algorithm or process controller. It is typically desirable to ensure that even if a significant change was made, the specifications are still satisfied. A change to the recipe could include time, pressures, flow rates, etc., or even a completely different recipe. If the recipe was significantly changed, then at block 115, the system calls for a measurement of the wafer.

The system also checks whether a fault was detected, such as in the processing device. Processing devices may be monitored by the factory automation system, for example to determine whether there is some problem with the processing device, either from the automation system side or from the processing device itself. Also, the processing device itself may include the ability to detect a fault. If a fault is detected, the system could subsequently measure to confirm that the wafer is within specifications. Thus, at block 117, it is determined whether a fault was detected. If a fault was detected, at block 123 the system measures the wafer. Since it is likely that the wafer has errors, it might be desirable not to use such measurements for feedback purposes.

There may be two cases for uses of measurement values. In the first case, the system uses the measurement value or stores that measurement value for further processing, such as measurements following a resource idle condition. In the second case, such as following a fault detection, the system may check the wafer or series of wafers for acceptability but does not store the value which might skew historical results. In the first case, the system is using the historical value for modeling of the processing device in order to better predict how the processing device will behave, or for other purposes. For example, where a fault is know to have occurred, the manufacturer will want to find and correct the cause of the fault, often by changing a process component or parameter. Thus, the process data attributed to a wafer that triggered detection of a fault is not indicative of the "normal" processing in the process system. On the other hand, for the fault detection case, the system merely ensures that that wafer is a good (e.g., usable) wafer versus a bad wafer. Unfortunately, usually following a fault there are several wafers in a series potentially affected by the fault, and it is desirable to measure the wafers in the series. Once the wafer(s) are measured following a fault, if the wafer(s) are bad, it is desirable to mark the wafer as questionable and discard the measurement value as well as perhaps the wafer itself.

Similarly, if a wafer is off target despite no change to the recipe, no detection of a fault, and no other likely cause of error, there is likely to be a series of off-target wafers. Consequently, where a wafer with errors is detected, the next wafer is significantly more likely to also experience errors. Thus, at block 119, the system checks whether the previous wafer was sufficiently far from the target, as determined by a previous measurement made in accordance with FIG. 1. If so, then at block 121 the system measures the current wafer as well.

Finally, it may be desirable to measure the wafer according to the initial sampling plan. Thus, at block 125, the system checks the initial sampling plan to advantageously determine whether the current wafer should be measured according to the initial sampling plan. If not, then the system does not measure the wafer. According to one or more embodiments, a modified sampling plan is used to measure the wafer under appropriate situations, such as after a change of type of chip.

Similarly, if no conditions affecting wafer processing are changed and if the series of wafers have been on target, one would expect the wafers to continue to be on target. Thus, as indicated at block 127, if the measurement of the last n wafers were sufficiently on target, there is no need to measure the wafer in this instance or as frequently. In this manner, the number of measurements can be reduced and processing time is potentially reduced. On the other hand, if at block 127 the system determines that the last series of n wafers were not on target, at block 129 the system measures the current wafer.

Reference is made to FIG. 2, a map of a wafer illustrating measurement regions for the within-wafer dynamic metrology. It is referred to as "within-wafer" since the system may be changing the metrology within the wafer, in distinction to the previously-described wafer-to-wafer dynamic metrology. (FIG. 3, described in detail below, illustrates an example of a flow chart for within-wafer dynamic metrology.)

Where the process performed by the processing device on the wafer is symmetric such that the system is affecting portions of the film on the wafer in a symmetric matter, it may be reasonable to measure fewer points, perhaps a measurement of only one radii. On the other hand, where there were previous steps performed by the processing device on the wafer that were asymmetric, information on additional measurement values may need to be captured. The number of desirable measurement points therefore additionally depends upon the type of process, and upon the step in the process if applicable.

For instance, given a very uniform process, perhaps only five points on the wafer need to be measured to provide sufficient precision. On the other hand, given a very non-uniform process or much unresolved information, perhaps twenty-five points should be measured to achieve a sufficient level of precision.

Typically the factory automation system, or the software in the factory automation system, is programmed to determine which process (or processes) or step within a process is being run on which processing device. Based on that information, the system can determine whether few or many points are desired for an adequately precise measurement or set of measurements of the wafer.

Consider, for example, a processing device with multiple chambers or resources independently processing wafers. In this example, the process control algorithm describes four recipe changes. The invention determines which wafers need to be measured (wafer-to-wafer), and any desired change in number of measurement points due to the dynamic recipe change (within-wafer). This metrology strategy consequently enables a dynamic metrology change based on the die map from the MES or other factory automation system.

The die map provides a pool of candidate points corresponding to a wafer to be measured, and the system can select from among the candidate points, the points that correspond most directly to the information needed or desired in connection with that wafer. The MES or other factory automation system provides information indicating allowable or relevant possible points that could be measured; from those candidate points, one or more embodiments of the present invention contemplate that the system selects the minimal set of points that would capture the desired information.

Figure 2A:
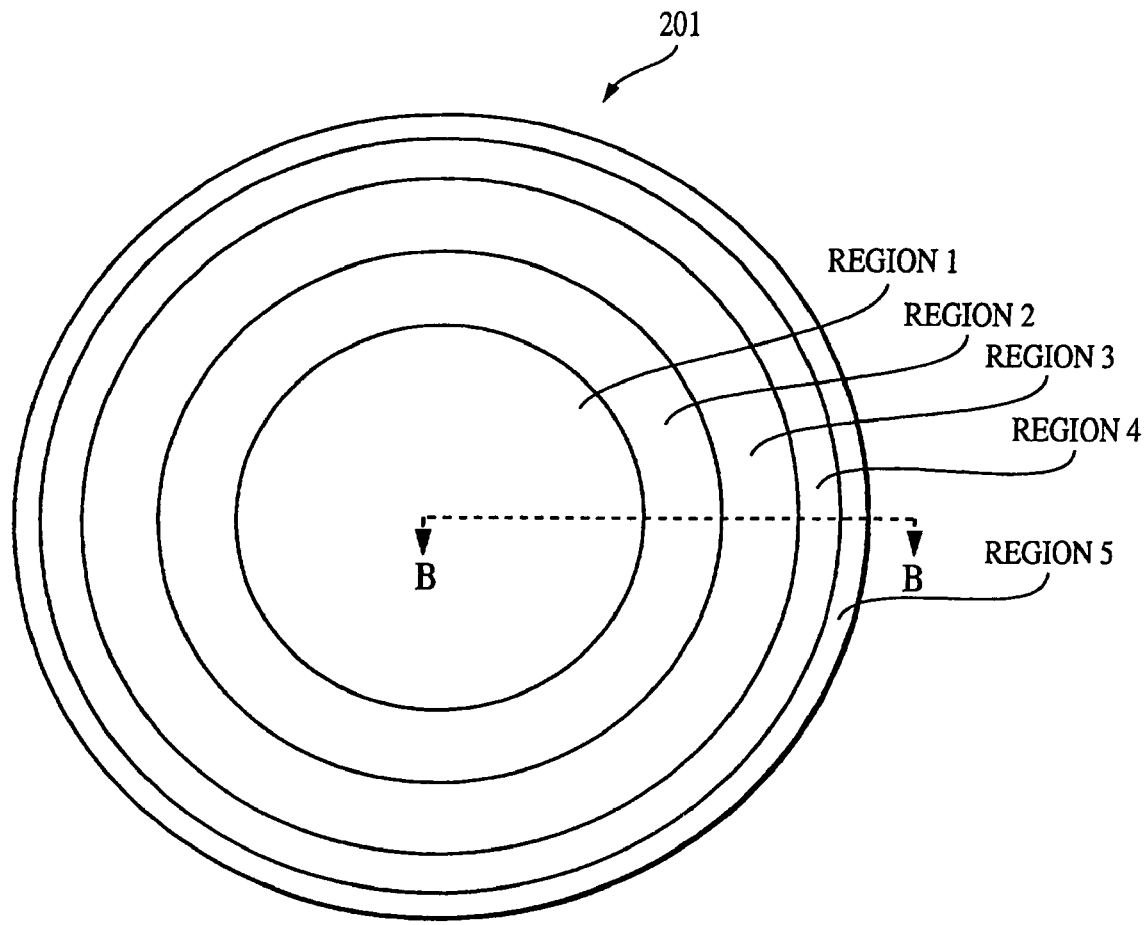
FIGS. 2A and 2B are an illustration of regions on a wafer, with FIG. 2A being a plan view of the wafer and FIG. 2B being a cross-section of the wafer along radius B-B of FIG. 2A.
Figure 2B:
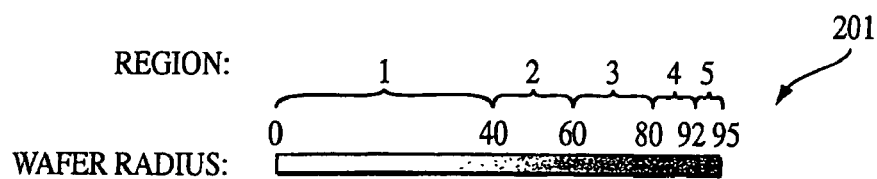

FIGS. 2A and 2B illustrate a plan view and a cross section of an example of a typical wafer 201, in this instance having radial regions 1 through 5. As shown in FIG. 2A, the illustrated wafer 201 is circular. Chips on the wafer are usually square and placed across the wafer. At the end of processing, the chips are divided from the wafer. FIG. 2B shows a cross section of the wafer of FIG. 2A, across section B-B from one edge to the center of the wafer. Region 1 extends radially from the center to 40 mm; region 2 extends from 40 mm to 60 mm; region 3 extends from 60 mm to 80 mm; region 4 extends from 80 mm to 92 mm; and region 5 extends from 92 mm to 95 mm. A wafer could be divided into more or fewer regions. Also, although the regions are illustrated as radial, the same concepts apply where the regions are neither circular nor radial.

A die map includes a sampling plan that optionally distinguishes among different regions of the wafer. Such a sampling plan would include information indicating a set of measurement points, associated with regions of the wafer.

Figure 3:
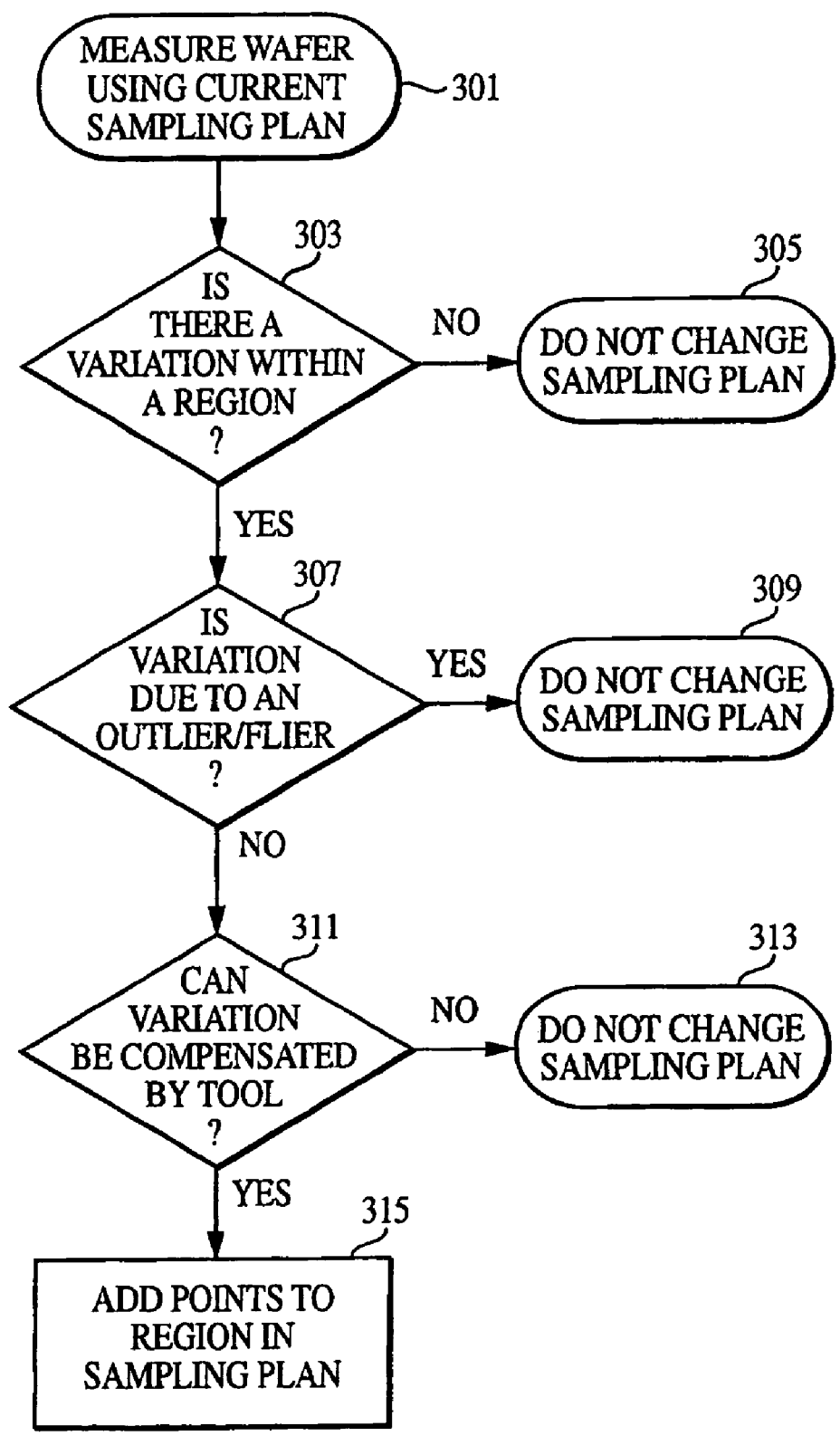
FIG. 3 is a flow chart showing one example of dynamic metrology for "within-wafer" processing in accordance with one or more embodiments of the present invention.

The flowchart of FIG. 3 discusses an example of within-wafer metrology, that is, when the system should or should not change the measurement points. FIG. 3 thus contrasts to FIG. 1, indicating whether to measure a current wafers (wafer-to-wafer dynamic metrology). FIG. 3 defines an example set of questions to determine whether more points are needed to measure a region variation within a given wafer.

Reference is now made to FIG. 3, illustrating an example of the within-wafer dynamic metrology, as contemplated by one or more embodiments of the present invention. At block 301, the wafer is measured by the metrology tool utilizing the current sampling plan. Having-measured the wafer, the system analyzes the current wafer to determine whether there are significant variations that might warrant changing the sampling plan for the next wafer. The wafers are potentially changed from run to run. That is, the system performs an action, and then based upon the results of that action, the system determines whether to utilize the same sampling plan for the next wafer or to do something different.

At block 303, it is determined whether there is a variation from the specification within one or more of the regions on the current wafer. If not, then as indicated by block 305 there is no need to add more sampling points.

At block 307, if there was a variation in a region, it is then determined whether the variation was due to an outlier or flier. An outlier or flier is a situation in which the measurement point is not an accurate reflection of the actual value. If there is a speck of dust on the wafer, for example, this may cause an erroneous thickness measurement; or for instance the actual measured point may be significantly distant from the correct measurement coordinates, resulting in significantly higher or lower thickness. An outlier or flier can be determined statistically in a number of ways based on how different the measured point is from the expected measurement. It may be difficult to determine in some cases whether the variation is due to a flier or if there is an actual variation. The data collected could be used to indicate a potentially defective die.

Of course, it should be understood that one or more embodiments of the present invention contemplate that any number of other causes for variations can be detected, and a decision made accordingly as to whether (and how) the sampling plan may be changed.

Referring still to FIG. 3, if the variation from the specification is due to an outlier or flier, then as indicated by block 309, the sampling plan is not changed. The measurement is not likely to be an accurate reflection of the wafer, and therefore the system should not react to the measurement.

At block 311, it is determined whether the variation from the specification is one for which the processing device can possibly compensate. For example, a processing device may be able to correct for radial variation, but not for a variation that is angular or azimuthal. Thus, at block 313, if the processing device cannot compensate for the variation in the region, then the sampling plan is not changed. On the other hand, if the processing device can compensate for the variation in the region, then at block 315 points are added to the region in the sampling plan for the next wafer in order to better characterize the region. Optionally, the data may be fed back to system controller in order to change the process in response to this drift condition.

According to one or more embodiments of the inventions, an error in one or more wafers may initiate some level of error handling and/or alarming. If there is an error that does not result in a change to the sampling plan, such as a non-systematic variation, and even if the system cannot compensate, in one or more embodiments of the present invention the system might generate an alarm or trigger performance of other error handling. If the error exhibits the characteristics of a systematic effect, such as wafers out of specification, then an alarm could be generated. If the error is one wafer that is out of specification, according to one or more embodiments of the invention, the system flags that wafer.

The flow chart of FIG. 3 illustrates one potential example of within-wafer metrology. Other types of checks and decisions are also contemplated and may be used in combination with, and/or replace, the detailed checks. For example, an additional check could include whether there is a large change in the recipe parameter that could have affected a specific region; if so, a determination can be made as to whether the change affected the region to the extent that more information is desirable; and if so, more metrology points can be added to the sampling plan.

Figure 4A:
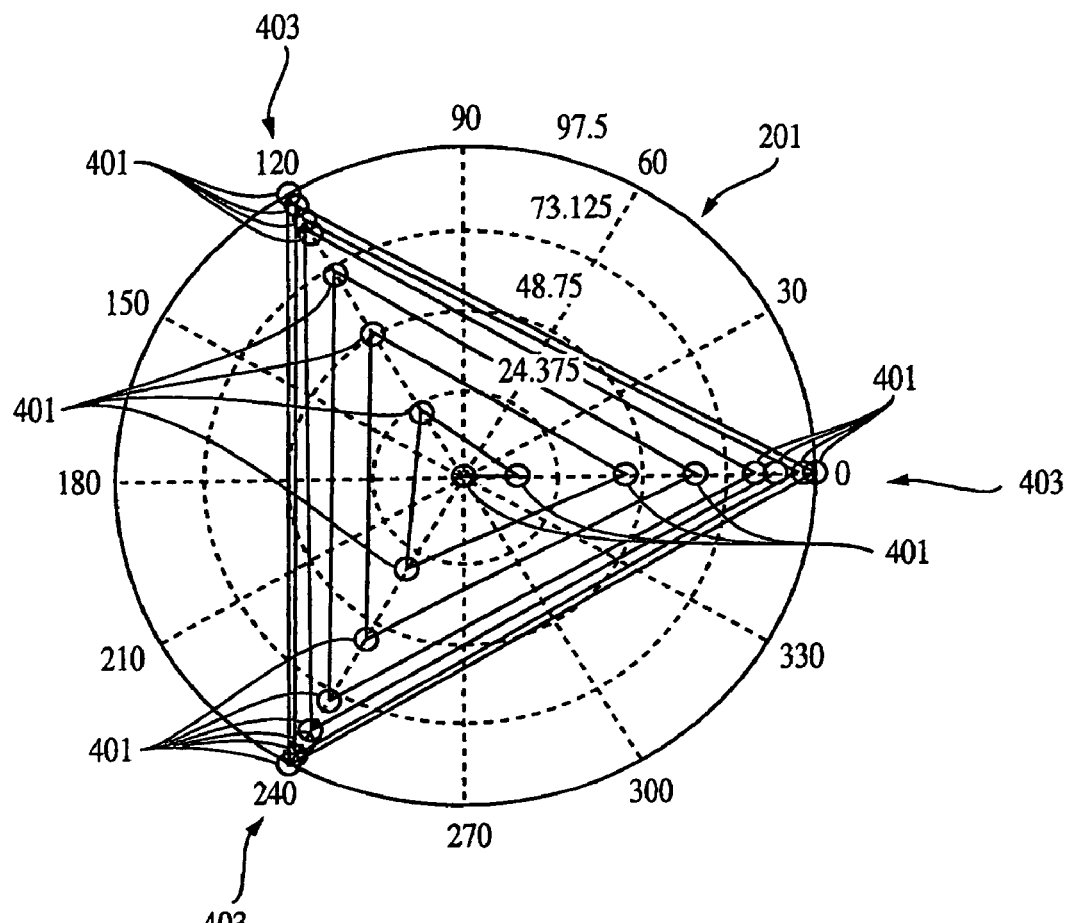
FIGS. 4A and 4B are a spiral sampling plan for a wafer for use with one or more embodiments of the invention, with FIG. 4A being a plan view of the wafer and FIG. 4B being a cross-section of the wafer along a radius of FIG. 4A.
Figure 4B:
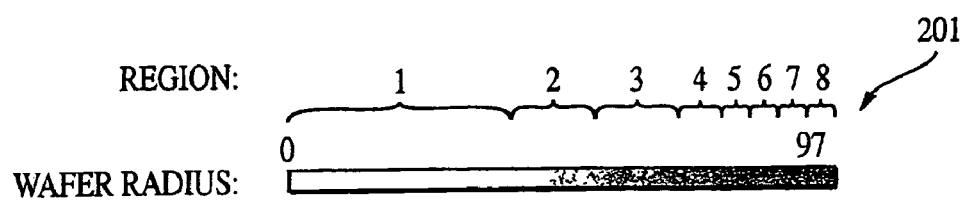

Reference is now made to FIGS. 4A and 4B, illustrating a plan view and sectional view, respectively, of a triangular spiral sampling plan. This is one example of a specific sampling plan, showing specific measurement points 401 in relation to a wafer 201. Other static sampling plans may be used. Nevertheless, the illustrated spiral sampling plan is well adapted to capturing both radial change as well as angular change Consider polar coordinates, where R is the radius and theta is the-angle; the triangular spiral sampling plan can capture variations in both the R direction and the theta direction. If the system can compensate only for variations that are radial, it may be desirable to add measurement points in the radial direction. Even if a significant angular variation was detected, one might not add any measurement points if the variation cannot be corrected anyway due to the manner of holding and/or spinning the wafer in the processing device.

Still referring to the example sampling plan illustrated in FIGS. 4A and 4B, the points 401 are distributed along three splines 403 radiating from the center of the wafer. The points 401 of this example are generally distributed in each of eight regions, shown in FIG. 4B. In this sampling plan one could potentially add points in a radial direction. There could be provided more or fewer regions in other embodiments of the invention. Suppose that in Region 1, which are all points radially from approximately 0 mm to 40 mm, there is a large variation; more measurement points could be added from the die map in order to better characterize that variation. FIG. 4A indicates equidistant radii at 24.375 mm from the center, 48.75 mm, 73.125 mm, and 97.5 mm for purposes of illustration. It should be noted that the distance between points 401 along spline 403 advantageously decreases towards the outer diameter of the wafer, to accommodate the increase in the surface area in relation to the width of the region.

FIGS. 4A and 4B illustrate only one of many potential sampling plans, in this instance a particular spiral sampling plan. Other sampling plans are possible. One advantage of the illustrated spiral sampling plan is that it quantifies not only radial but also angular variation. Another advantage is that it also measures a weighted region, that is it measures a selected number of coordinates in approximate proportion to the wafer surface area that they represent. Closer to the edge of the wafer, measurement points are more dense or closer together, since the radial distance is much further and the area of the region is greater in comparison to the width of the region.

Moreover, the variation on the edge typically will be much higher than variation toward the center of the wafer. The variation tends to increase proportionately further away from the-center. As a result, the density of the points to be measured may be advantageously increased as the points move radially outward.

Furthermore, the present invention optionally optimizes the measuring speed of the spiral sampling plan. In performance of metrology, a measurement is faster if performed radially across the wafer. According to the spiral sampling plan contemplated by one or more embodiments of the present invention, the wafer may be rotated approximately 120 degrees subsequent to a linear measurement, and then the next measurement is taken at the next point positioned radially across the wafer; then the wafer is again rotated approximately 120 degrees for the next measurement and so forth. The angle of rotation can be varied to correspond to the disposition of points as well as to accommodate the capabilities and/or limitations of the metrology tool. The wafer may be positioned on a pedestal and rotated and shifted while the metrology tool performs the measurement of the wafer.

Figure 5:
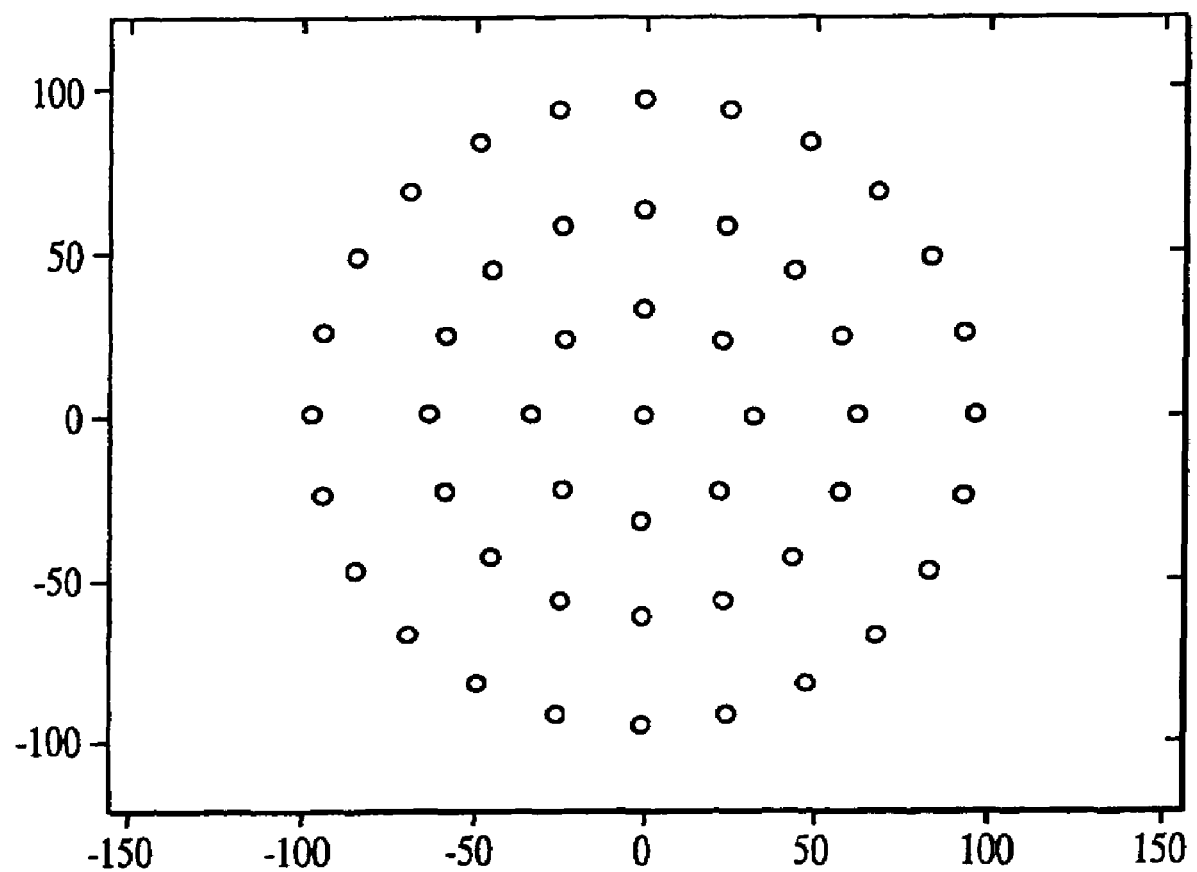
FIG. 5 is an example of another sampling plan for use with one or more embodiments of the invention.

Other sampling plans are also contemplated by one or more embodiments of the present invention, including a sampling plan with a large number of points, such as forty-nine (illustrated in FIG. 5), or a small number of points, such as five. Other sampling plans with other distributions of metrology points, such as distributed in concentric circles or star formations, or other variations may be used in one or more embodiments.

Figure 6:
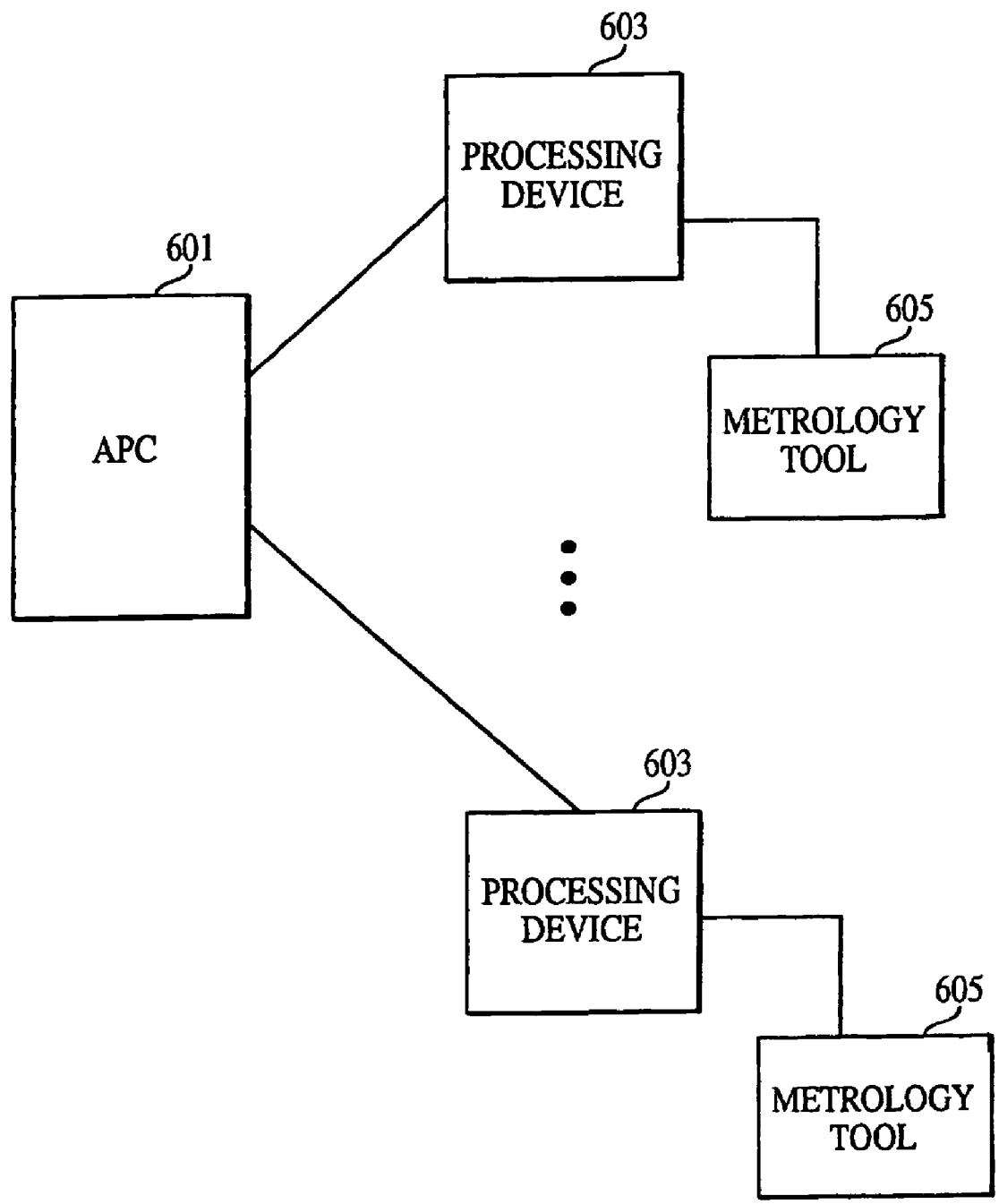
FIG. 6 is a block diagram of a computerized process control system which may be used in connection with one or more embodiments of the present invention.

Reference is made to FIG. 6, illustrating a possible computerized process control system which may be used in connection with one or more embodiments of the present invention. The system includes a standard factory automation system such as an APC 601. The APC 601 provides for central control of, and communication with, one or more standard processing devices 603 or resources. In turn, the processing device 603 communicates with and controls a standard metrology tool 605, which measures wafers in accordance with the processes described in connection with the present invention. Although FIG. 6 illustrates a typical system, other configurations are possible, such as having the metrology device(s) 605 communicate with the APC 601, or even omitting the APC 601 and having the metrology device 605 pattern the processes described herein.

Examples of processing devices that may be used in conjunction with the invention include chemical mechanical planarization (CMP) tools, etch tools, chemical vapor deposition (CVD) tools, lithography tools and others. It should be noted that the processing device may incorporate the metrology tool in some configurations.

While this invention has been described in conjunction with the specific embodiments outlined above, many alternatives, modifications and variations will be apparent to those skilled in the art. Accordingly, the preferred embodiments of the invention as set forth are intended to be illustrative and not limiting. Various changes may be made without departing from the spirit and scope of the invention as defined in the following claims.

For example, it would be possible to use any sampling plan with the invention. A sampling plan may include information in addition to that mentioned above. Further, a sampling plan may combine information from multiple sampling plans. As another example, although the above discusses a pre-determined or static sampling plan, such pre-determined or static sampling plan includes those sets of coordinate points measured on the fly such as just prior to wafer processing.

As another example, events or conditions in addition to, in combination with, and/or replacing these discussed above, could be checked as part of the wafer-to-wafer metrology determination. For example, a metrology tool, a processing device, or the system itself could indicate a fault. Moreover, it is possible that the reason for the fault could be indicated, and such information could be specifically checked and appropriately handled as well. The system could check for changes to the recipe in several different ways, such as replacement of a recipe, or change in recipe parameters.

Similarly, other events or conditions could be handled as part of the within-wafer determination. For example, there may be one or more regions of any shape on the wafer. As another example, points could be omitted from the sampling plan in appropriate cases. A further example includes other events mentioned above in connection with wafer-to-wafer processing.

As another example, the factory automation system may be a general purpose computer, or a specially programmed special purpose computer. It may also be implemented as a distributed computer system rather than as a single computer; some of the distributed system might include embedded systems. Further, the programming may be distributed among processing devices and metrology tools or other parts of the process control system. Similarly, the processing could be controlled by a software program on one or more computer systems or processors, or could be partially or wholly implemented in hardware. Moreover, the factory automation system may communicate directly or indirectly with the relevant metrology tool(s), processing devices, and metrology system(s); or the metrology tool(s), processing devices and metrology system(s) may communicate directly or indirectly with each other and the factory automation system.

What is claimed is:

1. A computer-implemented method of measuring at least one manufacturing characteristic for at least one wafer from a lot of wafers manufactured by a manufacturing process, comprising:
   providing information representative of a set of candidate points to be measured by the manufacturing process on the at least one wafer from the lot of wafers;
   executing, by a computer system, a plan for performing measurements on the at least one wafer from the lot of wafers to measure the at least one manufacturing characteristic, the plan defining at least one of: which of the wafers in the lot of wafers are to be measured and which candidate points on the wafers to be measured to make measurements on;
   detecting, by the computer system, one of a plurality of events or a lack of one of the plurality of events indicating a change in the manufacturing process, the change pertaining to at least one of: receiving new material in the manufacturing process, and detecting a change in a control parameter in the manufacturing process; and
   adjusting, by the computer system, the plan for performing measurements on the at least one wafer from the lot of wafers based on the detected change while the lot of wafers is being processed, wherein adjusting the plan includes at least one of: adjusting which wafers in the lot of wafers are to be measured and adjusting which candidate points on the wafers to be measured to make measurements on.

2. The method of claim 1, wherein the plan further includes information representative of a metrology recipe.

3. The method of claim 1, wherein the plan defines at least one region on the wafer, each of the candidate points corresponding to the at least one region.

4. The method of claim 1, wherein adjusting the plan comprises:
   determining at least one region corresponding to the detected change;
   selecting at least one measurement responsive to the candidate points corresponding to the determined region;
   assigning the selected at least one measurement as an additional measurement to be performed or as a measurement to be removed under the plan; and
   revising at least one of the measurements, the selected measurement, and the plan.

5. The method of claim 1, wherein adjusting the plan comprises:
   determining whether the detected change is of a type that affects a series of wafers; and
   determining whether to measure at least one of the wafers in the series of wafers based on the determination of whether the detected change is of a type that affects a series of wafers.

6. The method of claim 5, wherein there is provided a plurality of wafers in the lot of wafers, including the at least one wafer, and wherein the plan further comprises:
   first information representative of the wafers in the lot of wafers that are available to be measured; and
   second information representative of the wafers in the lot of wafers that are to be measured under the plan.

7. The method of claim 1, wherein the plan comprises:
   a plurality of splines radiating from a center of the at least one wafer, the candidate points being distributed along the splines; and
   a distribution of the candidate points along the splines weighted according to a surface area of the at least one wafer.

8. A computer-implemented system of measuring at least one manufacturing characteristic for at least one wafer from a lot of wafers manufactured by a manufacturing process, comprising:
   a memory to store information representative of a set of candidate points to be measured by the manufacturing process on the at least one wafer from the lot of wafers, and information representative of a plan for performing measurements on the at least one wafer from the lot of wafers to measure the at least one manufacturing characteristic, the plan defining at least one of: which of the wafers in the lot of wafers are to be measured and which candidate points on the wafers to be measured to make measurements on; and
   a processor, coupled to the memory, programmed to
      detect one of a plurality of events or a lack of one of the plurality of events indicating a change in the manufacturing process, the change pertaining to at least one of: receiving new material in the manufacturing process, and detecting a change in a control parameter in the manufacturing process; and
      adjust the plan for performing measurements on the at least one product from the lot of wafers based on the detected change while the lot of wafers is being processed, wherein adjusting the plan includes at least one of: adjusting which wafers in the lot of wafers are to be measured and adjusting which candidate points on the wafers to be measured to make measurements on.

9. The system of claim 8, wherein the manufacturing process is an automated semi-conductor manufacturing process, further comprising at least one metrology tool for performing measurements on the wafer, operatively connected to the processor.

10. The system of claim 8, wherein the plan further includes information representative of a metrology recipe.

11. The system of claim 8, wherein the plan defines at least one region on the wafer, each of the candidate points corresponding to the at least one region.

12. The system of claim 8, wherein to adjust the plan comprises:
- determining at least one region corresponding to the detected change;
- selecting at least one measurement responsive to the candidate points corresponding to the determined region;
- assigning the selected at least one measurement as an additional measurement to be performed or as a measurement to be removed under the plan; and
- revising at least one of the measurements, the selected measurement, and the plan.

13. The system of claim 8, wherein to adjust the plan comprises:
- determining whether the detected change is of a type that affects a series of wafers; and
- determining whether to measure at least one of the wafers in the series of wafers based on the determination of whether the detected change is of a type that affects a series of wafers.

14. The system of claim 13, wherein there is provided a plurality of wafers in the lot of wafers, including the at least one wafer, and wherein the plan further comprises:
- first information representative of the wafers in the lot of wafers that are available to be measured; and
- second information representative of the wafers in the lot of wafers that are to be measured under the plan.

15. The system of claim 8, wherein the plan comprises:
- a plurality of splines radiating from a center of the at least one wafer, the candidate points being distributed along the splines; and
- a distribution of the candidate points along the splines weighted according to a surface area of the at least one wafer.

16. A tangible computer readable medium for storing executable instructions which when executed on a processing system cause the processing system to perform a method for measuring at least one manufacturing characteristic for at least one wafer from a lot of wafers manufactured by a manufacturing process, the method comprising:
- providing information representative of a set of candidate points to be measured by the manufacturing process on the at least one wafer from the lot of wafers;
- executing, by a computer system, a plan for performing measurements on the at least one wafer from the lot of wafers to measure the at least one manufacturing characteristic, the plan defining at least one of: which of the wafers in the lot of wafers are to be measured and which candidate points on the wafers to be measured to make measurements on;
- detecting, by the computer system, one of a plurality of events or a lack of one of the plurality of events indicating a change in the manufacturing process, the change pertaining to at least one of: receiving new material in the manufacturing process, and detecting a change in a control parameter in the manufacturing process; and
- adjusting, by a computer system, the plan for performing measurements on the at least one product from the lot of wafers based on the detected change while the lot of wafers is being processed, wherein adjusting the plan includes at least one of: adjusting which wafers in the lot of wafers are to be measured and adjusting which candidate points on the wafers to be measured to make measurements on.

17. The tangible computer readable medium of claim 16, wherein the plan defines at least one region on the wafer, each of the candidate points corresponding to the at least one region.

18. The tangible computer readable medium of claim 16, wherein adjusting the plan comprises:
- determining at least one region corresponding to the detected change;
- selecting at least one measurement responsive to the candidate points corresponding to the determined region;
- assigning the selected at least one measurement as an additional measurement to be performed or as a measurement to be removed under the plan; and
- revising at least one of the measurements, the selected measurement, and the plan.

19. The tangible computer readable medium of claim 16, wherein adjusting the plan comprises:
- determining whether the detected change is of a type that affects a series of wafers; and
- determining whether to measure at least one of the wafers in the series of wafers based on the determination of whether the detected change is of a type that affects a series of wafers.

* * * * *